(12) United States Patent
Morton et al.

(10) Patent No.: US 7,132,123 B2
(45) Date of Patent: *Nov. 7, 2006

(54) HIGH REP-RATE LASER WITH IMPROVED ELECTRODES

(75) Inventors: Richard G. Morton, San Diego, CA (US); Timothy S. Dyer, Oceanside, CA (US); Thomas D. Steiger, San Diego, CA (US); Richard C. Ujazdowski, Poway, CA (US); Tom A. Watson, Carlsbad, CA (US); Bryan Moosman, San Diego, CA (US); Alex P. Ivaschenko, San Diego, CA (US); Walter Gillespie, Poway, CA (US); Curtis Rettig, Vista, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/629,364

(22) Filed: Jul. 29, 2003

(65) Prior Publication Data

US 2004/0022292 A1 Feb. 5, 2004

Related U.S. Application Data

(60) Division of application No. 10/104,502, filed on Mar. 22, 2002, now Pat. No. 6,960,706, which is a continuation-in-part of application No. 10/081,589, filed on Feb. 21, 2002, now abandoned, and a continuation-in-part of application No. 09/953,026, filed on Sep. 13, 2001, now Pat. No. 6,711,202, and a continuation-in-part of application No. 09/776,044, filed on Feb. 1, 2001, now Pat. No. 6,854,132, and a continuation-in-part of application No. 09/768,753, filed on Jan. 23, 2001, now Pat. No. 6,414,979, and a continuation-in-part of application No. 09/742,485, filed on Dec. 20, 2000, now abandoned, and a continuation-in-part of application No. 09/703,697, filed on Nov. 1, 2000, now Pat. No. 6,363,094, and a continuation-in-part of application No. 09/590,961, filed on Jun. 9, 2000, now Pat. No. 6,466,602, and a continuation-in-part of application No. 09/590,958, filed on Jun. 9, 2002, now Pat. No. 6,560,263.

(51) Int. Cl.
*B05D 5/12* (2006.01)
*B05D 3/02* (2006.01)

(52) U.S. Cl. .................. 427/58; 427/180; 427/372.2; 427/384; 427/195; 427/201

(58) Field of Classification Search .................. 427/58, 427/180, 195, 201, 372.2, 384
See application file for complete search history.

(56) References Cited

U.S. PATENT DOCUMENTS

| | | | | |
|---|---|---|---|---|
| 3,828,277 | A * | 8/1974 | Otto et al. | 372/82 |
| 4,245,194 | A | 1/1981 | Fahlen et al. | 331/94.5 |
| 4,414,488 | A | 11/1983 | Hoffmann et al. | 315/39 |
| 4,546,482 | A | 10/1985 | Bagaglia et al. | 372/86 |
| 4,547,886 | A | 10/1985 | Kaminski et al. | 372/59 |
| 4,686,682 | A | 8/1987 | Haruta et al. | 372/87 |
| 4,703,490 | A | 10/1987 | Brumme et al. | 372/86 |
| 4,774,714 | A | 9/1988 | Javan | 372/109 |
| 4,800,567 | A * | 1/1989 | Karube | 372/87 |
| 4,876,693 | A | 10/1989 | Lucero et al. | 372/82 |
| 4,959,840 | A | 9/1990 | Akins et al. | 372/57 |
| 5,070,513 | A | 12/1991 | Letardi | 372/83 |
| 5,247,534 | A | 9/1993 | Muller-Horsche | 372/58 |
| 5,359,620 | A | 10/1994 | Akins | 372/58 |
| 5,535,233 | A | 7/1996 | Mizoguchi et al. | 372/87 |
| 5,557,629 | A | 9/1996 | Mizoguchi et al. | 372/87 |
| 5,586,134 | A | 12/1996 | Das et al. | 372/38 |
| 5,771,258 | A | 6/1998 | Morton et al. | 372/57 |
| 5,771,259 | A * | 6/1998 | Dvorkin | 372/87 |
| 6,038,055 | A | 3/2000 | Hansch et al. | 359/279 |
| 2003/0012234 | A1 | 1/2003 | Watson et al. | 372/25 |
| 2003/0031216 | A1 | 2/2003 | Fallon et al. | 372/29.01 |
| 2003/0138019 | A1 | 7/2003 | Rylov et al. | 372/58 |

FOREIGN PATENT DOCUMENTS

JP 01/154577 * 6/1989

| | | | |
|---|---|---|---|
| JP | 2631607 | 7/1997 | 3/38 |

OTHER PUBLICATIONS

Nguyen, Thinh, et al., "Diffusion Bonding—An Advanced Material Process for Aerospace Technology", http://www.vacets.org/vtic97/ttnguyen.htm.

\* cited by examiner

*Primary Examiner*—Brian K. Talbot
(74) *Attorney, Agent, or Firm*—William C. Cray

(57) ABSTRACT

The present invention provides a gas discharge laser having at least one long-life elongated electrode for producing at least 12 billion high voltage electric discharges in a fluorine containing laser gas. In a preferred embodiment at least one of the electrodes is comprised of a first material having a relatively low anode erosion rate and a second anode material having a relatively higher anode erosion rate. The first anode material is positioned at a desired anode discharge region of the electrode. The second anode material is located adjacent to the first anode material along at least two long sides of the first material. During operation of the laser erosion occurs on both materials but the higher erosion rate of the second material assures that any tendency of the discharge to spread onto the second material will quickly erode away the second material enough to stop the spread of the discharge. In a preferred embodiment the anode is as described above and the cathode is also a two-material electrode with the first material at the discharge region being C26000 brass and the second material being C36000 brass. A pulse power system provides electrical pulses at rates of at least 1 KHz. A blower circulates laser gas between the electrodes at speeds of at least 5 m/s and a heat exchanger is provided to remove heat produced by the blower and the discharges.

5 Claims, 20 Drawing Sheets

CATHODE

ANODE

CATHODE

ANODE

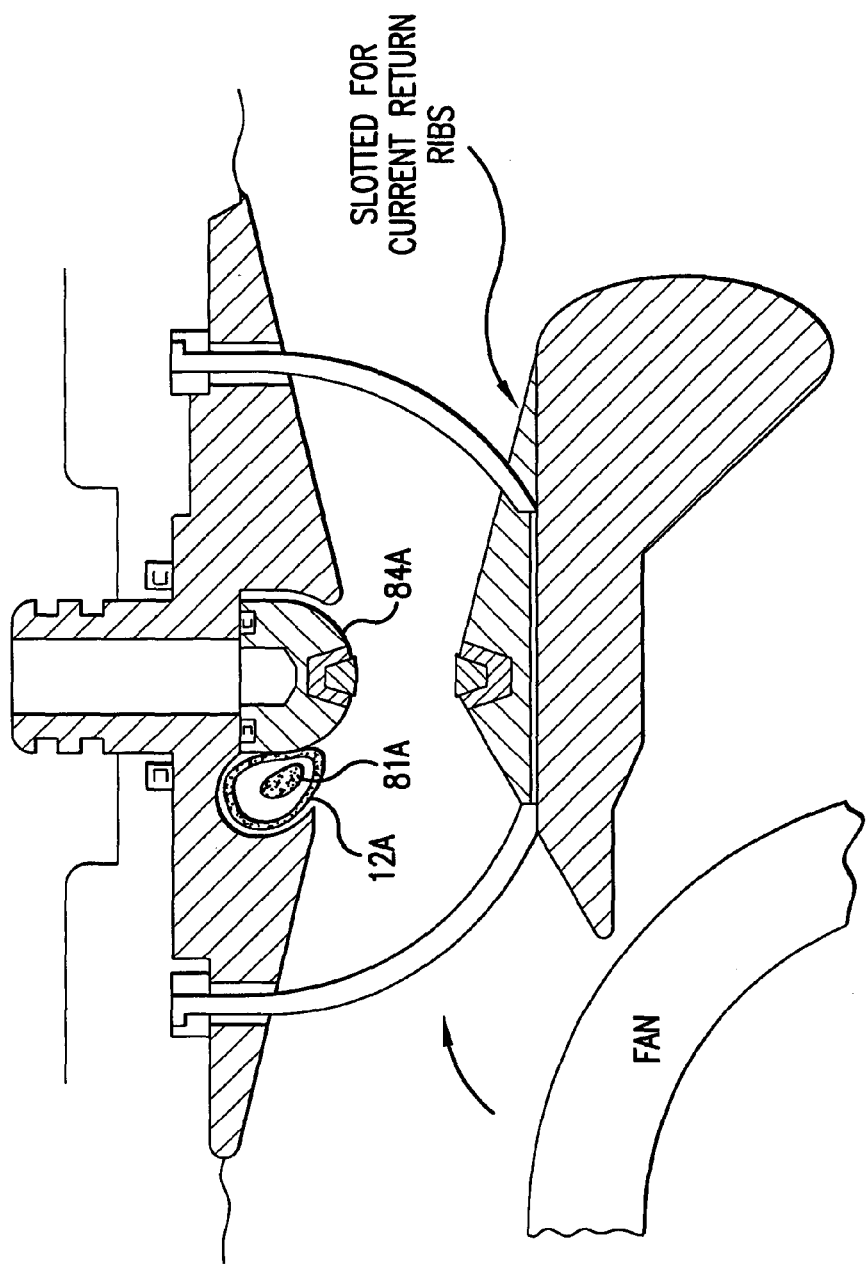

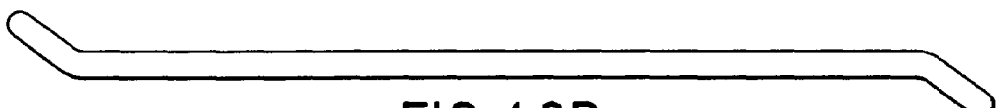
FIG.16A
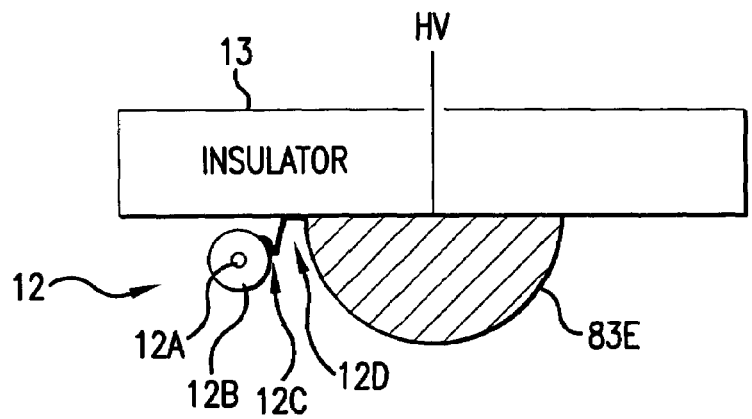
FIG.16B
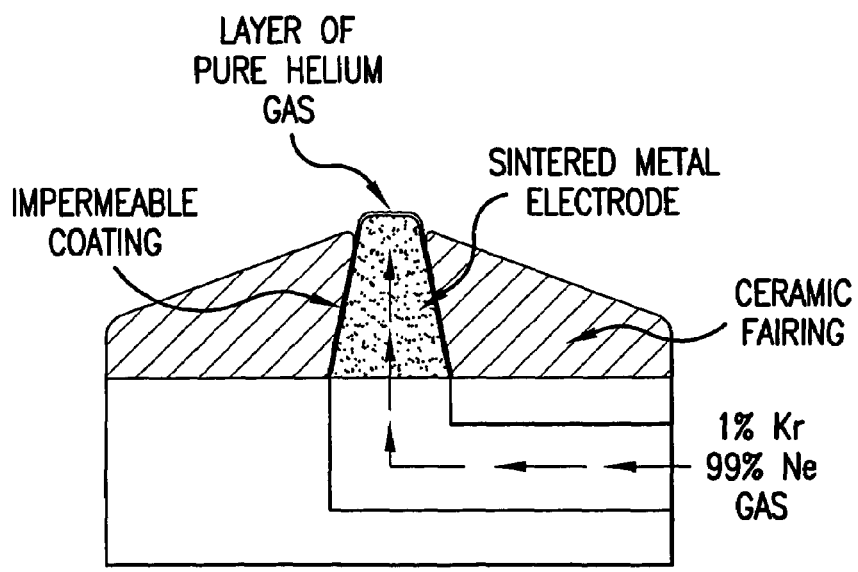
FIG.17
FIG.18

HIGH REP-RATE LASER WITH IMPROVED ELECTRODES

This application is a divisional of U.S. Ser. No. 10/104,502 filed Mar. 22, 2002 now U.S. Pat. No. 6,690,706 which is a continuation-in-part of U.S. Ser. No. 10/081,589 filed Feb. 21, 2002 now abandoned; U.S. Ser. No. 09/953,026 filed Sep. 13, 2001 now U.S. Pat. No. 6,711,202, U.S. Ser. No. 09/776,044 filed Feb. 1, 2001, which issued issued on Jun. 24, 2003 as U.S. Pat. No. 6,584,132; U.S. Ser. No. 09/768,753 filed Jan. 23, 2001, which issued on Jul. 2, 2002 as U.S. Pat. No. 6,414,979; U.S. Ser. No. 09/742,485 filed Dec. 20, 2000, now abandoned; U.S. Ser. No. 09/703,697, filed Nov. 1, 2000, which issued on Mar. 26, 2002 as U.S. Pat. No. 6,363,094; U.S. Ser. No. 09/590,961, filed Jun. 9, 2000, which issued on Oct. 15, 2002 as U.S. Pat. No. 6,466,602; Ser. No. 09/590,958, filed Jun. 9, 2000, which issued on May 6, 2003 as U.S. Pat. No 6,560,263; all of which are incorporated by reference herein.

BACKGROUND OF THE INVENTION

The KrF Excimer Laser

The principal components of a prior art KrF excimer laser system are shown in FIGS. 1, 2 and 3. The laser system is used as a light source for integrated circuit lithography. These components include a laser chamber housing 2. The housing contains two electrodes 84 and 83 each about 50 cm long and spaced apart by about 20 mm, a blower 4 for circulating a laser gas between the electrodes at velocities fast enough to clear (from a discharge region between the two electrodes) debris from one pulse prior to the next succeeding pulse at a pulse repetition rate in the range of 1000 Hz to 4,000 Hz or greater, and one or more water cooled finned heat exchanger 6 for removing heat added to the laser gas by the fan and by electric discharges between the electrodes. The word "debris" is used here to define any physical condition of the gas after a laser pulse, which is different from the condition of the gas prior to the pulse. The chamber may also include baffles and vanes for improving the aerodynamic geometry of the chamber. The laser gas is comprised of a mixture of about 0.1 percent fluorine, about 1.0 percent krypton and the rest neon. Each pulse is produced by applying a very high voltage potential across the electrodes with a pulse power system 8, shown as an electrical circuit in FIG. 3, which causes discharges (between the electrodes) lasting about 30 nanoseconds to produce a gain region about 20 mm high, 3 mm wide and 500 mm long. Each discharge deposits about 2.5 J of energy into the gain region. As shown in FIG. 2, lasing is produced in a resonant cavity, defined by an output coupler 2A and a grating based line narrowing unit (called a line narrowing package or LNP, shown disproportionately large) 2B comprising a three prism beam expander, a tuning mirror and a grating disposed in a Littrow configuration. The energy of the output pulse 3 in this prior art KrF lithography laser is typically about 10 mJ. This KrF laser light source produces a narrow band pulsed ultraviolet light beam with a wavelength at about 248 nm. These lasers typically operate in a so-called "burst mode" consisting of bursts of pulses at a pulse repetition rate in the range of about 1000 to 4000 Hz. Each burst consists of a number of pulses, for example, about 80 to 300 pulses, each burst illuminating a single die section on a wafer with the bursts separated by off times of a fraction of a second while the lithography machine shifts the illuminating beam between die sections. There is another longer off time of a few seconds when a new wafer is loaded. Therefore, in production, for example, a 2000 Hz, KrF excimer laser may operate at a duty factor of about 30 percent. The operation is 24 hours per day, seven days per week, 52 weeks per year. A laser operating at 2000 Hz "around the clock" at a 30 percent duty factor will accumulate more than 1.5 billion pulses per month. Any disruption of production can be extremely expensive. For these reasons, prior art excimer lasers designed for the lithography industry are modular. The modules typically can be replaced within a few minutes so that maintenance down time is minimized. Laser availability of these lasers is typically higher than 99 percent.

Maintaining high quality of the laser beam produced by these lasers is very important because the lithography systems in which these laser light sources are used are currently required to produce integrated circuits with features smaller than 0.25 microns and feature sizes get smaller each year. As a result the specifications placed on the laser beam limit the variation in individual pulse energy, the variation of the integrated energy of series of pulses, the variation of the laser wavelength and the magnitude of the spectral bandwidth of the laser beam.

Prior Art Electrodes

Prior art electrodes for the gas discharge lasers referred to above are typically about 50 cm long, may be about 3 cm wide and may have cross section shapes similar to those shown in FIG. 1 at 83 and 84. The actual discharges between the electrodes typically need to be a few millimeters wide (e.g., 3–4 mm) and this need determines the shape of the electrodes. The two electrodes shown produce relatively very high electrode fields over a 3–4 mm wide region in the central region of both of the electrodes (called herein the discharge footprint or discharge surface) to produce approximately rectangles discharges about 3–4 mm in width with a height approximately equal to the electrode spacing and the length of the discharge region is about 500 cm. One problem with these prior art electrodes is that erosion in the approximately 3–4 mm discharge footprint port of both electrodes over several billion pulses causes changes in the cross section shape of the electrode which alters the electric fields which in turn affect the discharge footprint so that the discharge shape is no longer uniform and may become substantially wider, narrower, split or otherwise distorted thereby adversely affecting laser beam quality, and reducing laser efficiency.

Electrode designs have been proposed which are intended to minimize the effects of erosion by providing on the electrode a protruding part having the same width as the discharge. Some examples are described in Japanese Patent No. 2631607. These designs, however, produce adverse effects on gas flow if the protrusion is large and if the protrusion is small; it is eroded away relatively quickly.

Other Lithography Lasers

Other gas discharge lasers used as lithography light sources, very similar to the KrF laser, are the ArF (argon fluorine) laser and the $F_2$ (fluorine molecular laser). In the ArF laser the active gases are a mixture primarily of argon and fluorine with neon as a buffer gas, and the wavelength of the output beam is in the range of about 193 nm. These ArF lasers are just now being used to a significant extent for integrated circuit fabrication, but the use of these lasers is expected to grow rapidly. In the $F_2$ laser, expected to be used extensively in the future for integrated circuit fabrication, the active gas is $F_2$ and a buffer gas could be neon or helium or a combination of neon and helium. All of these gas discharge lithography lasers utilize similar electrodes although the spacing between them may be slightly different.

What is needed is a gas discharge laser having electrodes which do not adversely affect gas flow and can withstand many billions of electric discharges without substantial adverse effects on laser beam quality.

SUMMARY OF THE INVENTION

The present invention provides a gas discharge laser having at least one long-life elongated electrode for producing at least 12 billion high voltage electric discharges in fluorine containing laser gas. In a preferred embodiment at least one of the electrodes is comprised of a first material having a relatively low anode erosion rate and a second anode material having a relatively higher anode erosion rate. The first anode material is positioned at a desired anode discharge region of the electrode. The second anode material is located adjacent to the first anode material along at least two long sides of the first material. During operation of the laser erosion occurs on both materials but the higher erosion rate of the second material assures that any tendency of the discharge to spread onto the second material will quickly erode away the second material enough to stop the spread of the discharge. In a preferred embodiment the anode is as described above and the cathode is also a two-material electrode with the first material at the discharge region being C26000 brass and the second material being C36000 brass. A pulse power system provides electrical pulses at rates of at least 1 KHz. A blower circulates laser gas between the electrodes at speeds of at least 5 m/s and a heat exchanger is provided to remove heat produced by the blower and the discharges.

In preferred embodiments the two-material electrode is an anode of a fluorine containing gas discharge laser. A portion of the anode located at the discharge surface of the anode, is comprised of an anode material containing lead along with other metals chosen to produce during operation a porous insulating layer covering the discharge surface of the anode. The layer is produced by fluorine ion sputtering on the anode surface which creates the insulating layer comprised in part of lead fluoride as well as fluorides of other metals. In a particular preferred embodiment the anode is fabricated in two parts, a second part having the general shape of a prior art anode with a trench shaped cavity at the top. The material for this part such as C26000 brass will be eroded if subject to electric discharge in the normal discharge laser gas environment. A first part comprised of brass having a lead content of greater than 3% is soldered into the trench and protrudes above the surface by about 0.2 millimeter. When the anode is installed in the laser and is subjected to pulse discharges in a fluorine containing laser gas environment an insulating layer, comprising porous lead fluoride, forms on the surface of the first part protecting it from significant erosion. Applicants' computer electric field models have shown that the insulating layer does not significantly affect the electric field between the cathode and the anode. The overall electrode shape is such that there are no significant discharges from the second part at beginning of operation with the electrodes. To the extent discharges do occur from the second part, erosion will occur at the discharge sites reducing the height of the anode in the region of the discharge which has the effect of reducing the discharge from the second part. About 50,000 small holes develop in the insulating layer on the first part which permit electrons to flow freely to and from the metal surface of the anode. However, fluorine ion sputtering on the metal surface of the anode is substantially limited after the insulating layer has developed. Applicants believe that the reduction in fluorine ion sputtering results from a reduced number of fluorine ions reaching the metal surface and a reduction in energy of the ions that do reach the metal surface.

Applicants' tests have shown that the porous insulating layer that covers substantially all of the discharge surface of the anode does not significantly interfere with the electric field between the electrodes and helps control the shape of the discharge making it more spatially uniform over chamber life, as compared to prior art anode designs. This increase uniformity in discharge shape results in greatly improved laser pulse quality over chamber life. Better discharge shape also minimizes the adverse effect of acoustic disturbances within the chamber resulting from reflected acoustic waves from one pulse reflecting back into the discharge region during the immediately following pulse. Embodiments of the present invention provide decreased burn-in times extended operating lifetimes and improved laser beam quality and beam stability.

BRIEF DESCRIPTION OF THE DRAWINGS

FIGS. 12A and 12B show cross-sections of aerodynamically designed chambers.

FIGS. 16A and 16B compares a preferred embodiment with a prior art electrode.

FIG. 17 shows an improved electrode configuration for better pre-ionization.

FIG. 18 shows a technique for reducing fluorine caused anode erosion.

DETAILED DESCRIPTION OF PREFERRED EMBODIMENTS

Preferred embodiments of the present invention can be described by reference to the drawings.

Pulse Power Supply System

Figure 3:
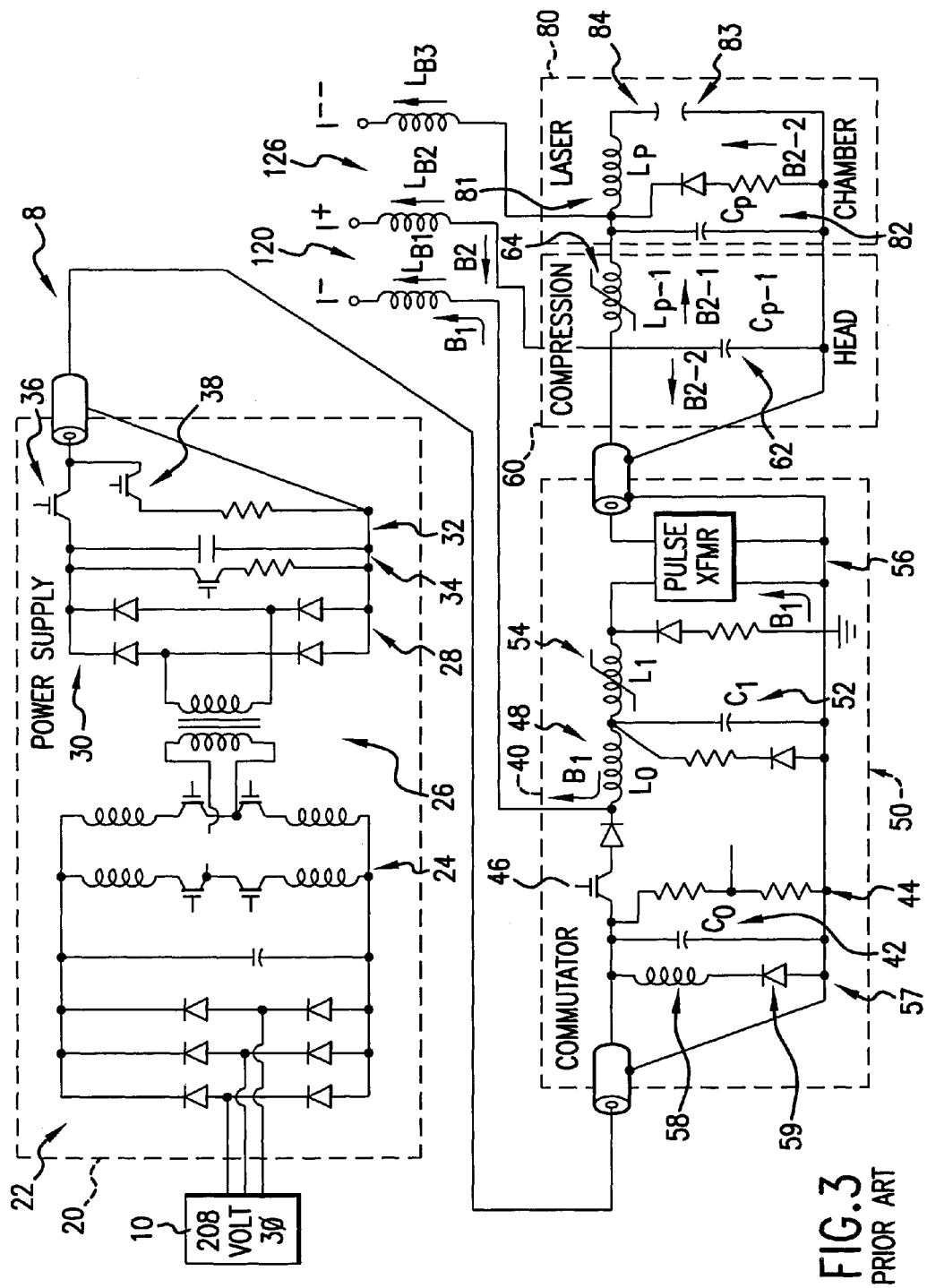
FIG. 3 shows the principal features of a pulse power system of a prior-art gas discharge laser.

The principal components of an electrical circuit 8 for providing pulse power to produce electrical discharges in a gas discharge laser are shown in FIG. 3. The pulse power system operates from a standard 208-volt, 3 phase electrical source. A power supply using rectifier 22, inverter 24, transformer 26 and rectifier 30 charges charging capacitor $C_o$ 42 to a voltage level between about 500 to 1200 volts as directed by a laser control processor (not shown). The laser control processor directs the closing of an IGBT switch 46 when a pulse is desired which causes the energy on $C_0$ to be discharged into the follow-on portions of the pulse power system. The charge on $C_0$ is transferred successively to capacitor bank $C_1$ 52 through inductor 48 then through saturable inductor 54 and through voltage transformer 56 to capacitor bank $C_{p-1}$ 62 and then through saturable inductor 64 to peaking capacitor bank $C_p$ 82. As shown in FIG. 3, peaking capacitor bank $C_p$ is connected electrically in parallel with electrodes 84 and 83.

Figure 4A:
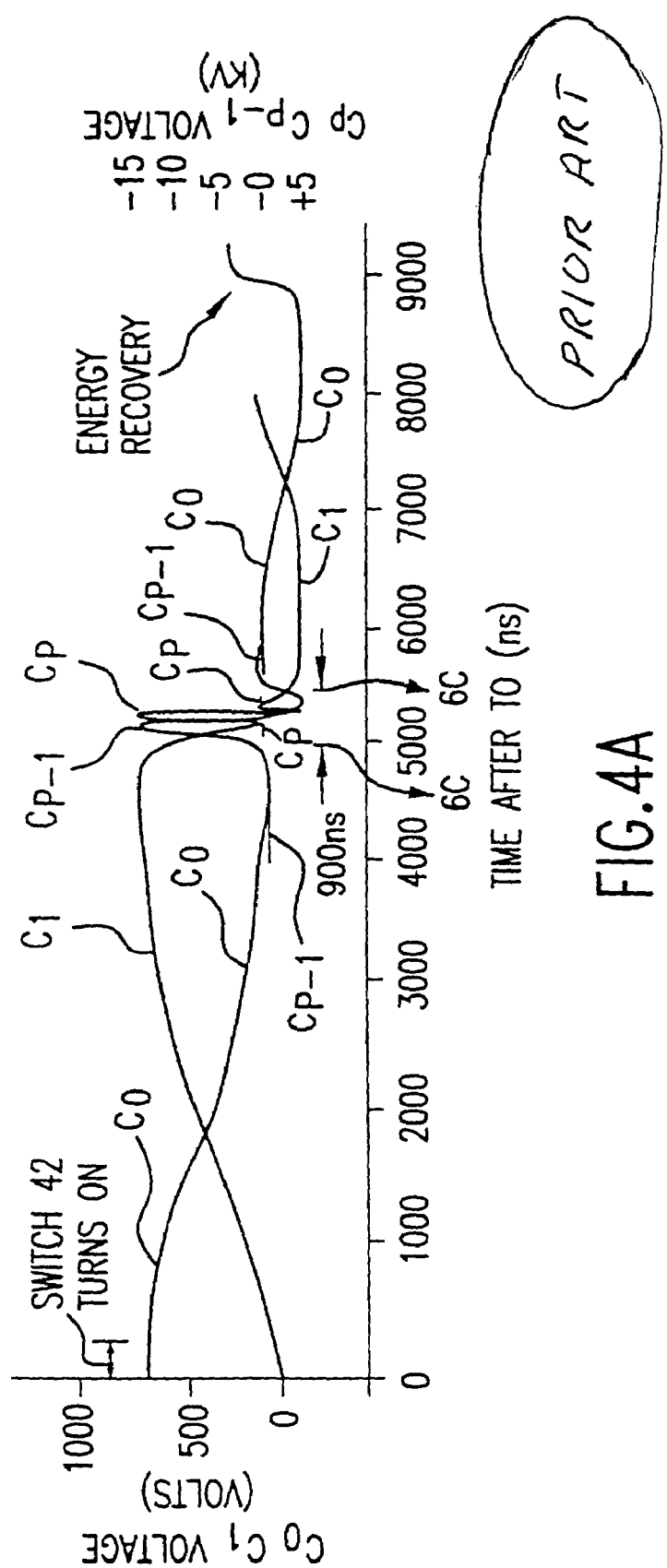
FIGS. 4A and 4B show electrical pulse shapes on the FIG. 3 pulse power system.
Figure 4B:
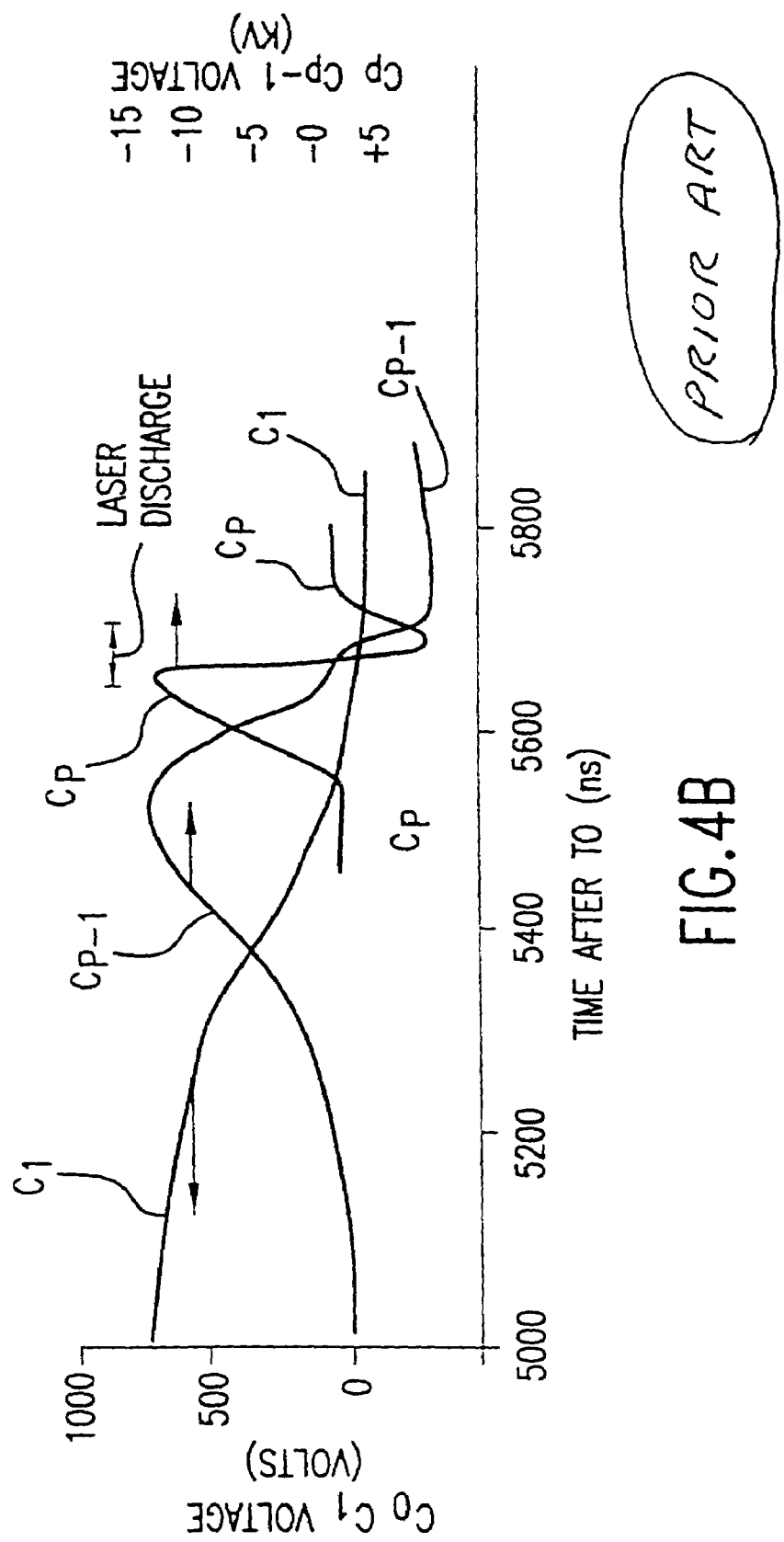

FIG. 4A shows the potential on capacitor banks $C_0$, $C_1$, $C_{p-1}$ and $C_p$ as a function of time beginning with the closing of switch 42 and for the following 9 microseconds. FIG. 4B shows an 800 ns time slice just before and after the discharge. The reader should note that the peaking capacitor bank $C_p$ is charged to approximately −15,000 V just prior to the discharge. The discharge lasts about 30 ns. During the discharge, the electron flow is first from the upper electrode, cathode 84 to the lower grounded electrode, anode 83. A current "overshoot" charges $C_p$ to a positive value of about +6,000 V at which time the downward flow of electrons is reversed after which the electron flow is from the lower grounded electrode to the upper electrode during the last approximately 15 ns of the discharge, all as shown in FIG. 4B.

New Electrode

Figure 1:
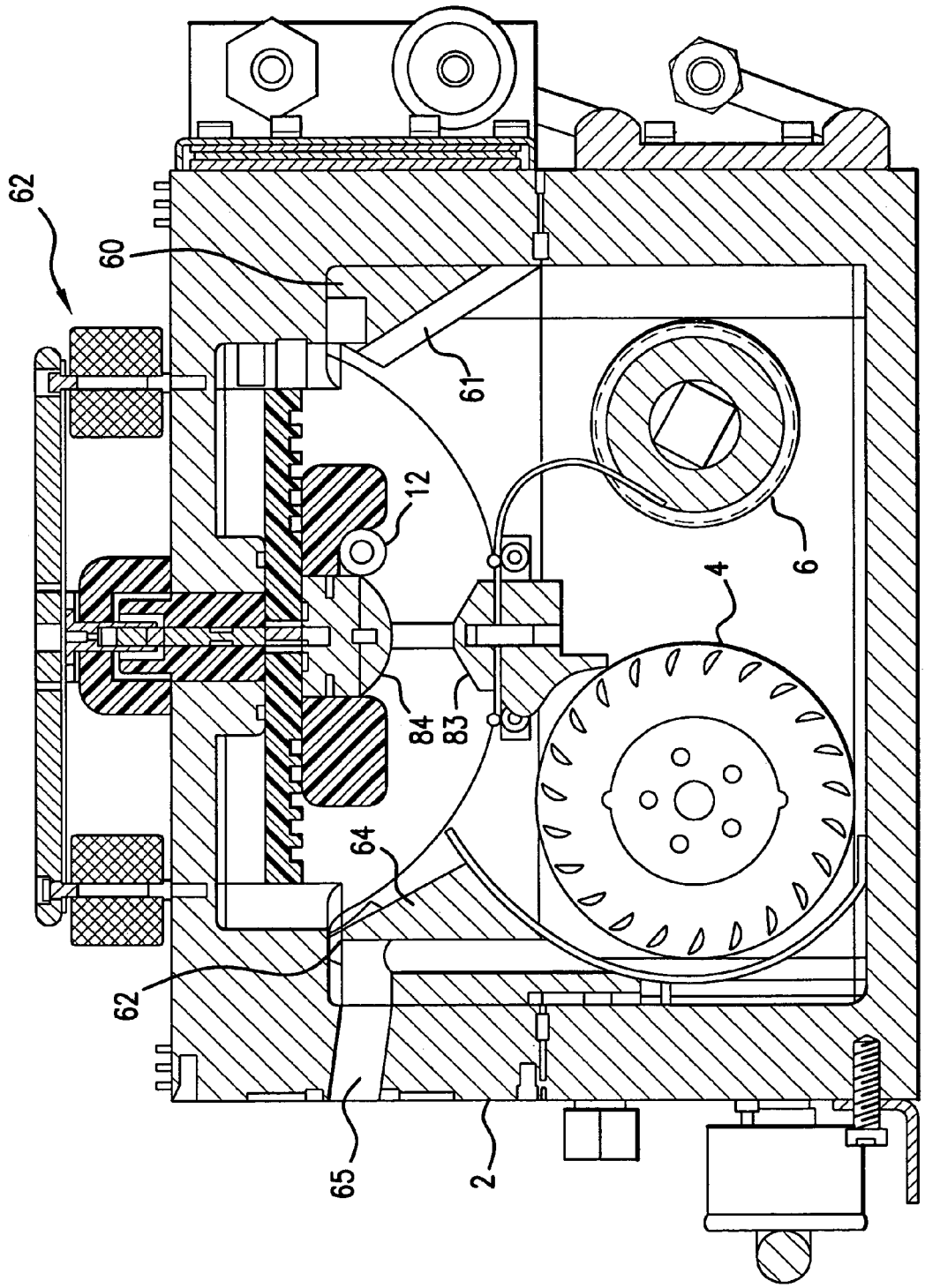
FIG. 1 shows a cross section of a chamber of a prior-art gas discharge laser.

The surface of a newly fabricated prior art brass electrode of the type shown in FIG. 1 is very smooth. However, when viewed under a high power microscope the surface actually is comprised of longitudinal rows running the length of the electrode and spaced apart by about 1 to 2 microns with alternating ridges and valleys, with the bottom of the valleys being about 1 to 2 microns lower than the top of the ridges. The surface under the microscope appears as a long narrow plowed field resulting from machining operations.

Burnt-In Electrodes

The typical prior art practice when assembling a new laser system or rebuilding a laser chamber is to subject the chamber to a "burn in" phase in which the chamber is operated for about 500 million pulses. At 2000 Hz this requires about 72 hours. During this period, substantial sputtering occurs on the discharge surface of each electrode. The discharge surface is about 3.5 mm wide and about 545 mm long on each electrode. The sputtering occurring on the discharge surfaces of the electrodes and the discharges between the electrodes substantially alters the surface of the electrodes on the discharge portion of the surfaces. The "plowed rows" are no longer apparent after "burn-in" but are replaced mostly by relatively randomly spaced shallow blob indentations typically about 5 microns deep and about 3 to 10 microns wide. These blob-shaped indentations or craters are spaced close together (or slightly overlapping) on the cathode. They are typically somewhat farther apart on the anode so that there are about four times as many per area on the cathode as compared to the anode.

Erosion

Applicants have discovered that electrode erosion occurs on both electrodes but that the erosion rate of the grounded electrode (anode 83) is about four times that of the high negative voltage electrode (cathode 84). In almost all other gas discharge devices where electrode erosion is a problem, e.g., flashlamps, it is the cathode where most of the erosion occurs. Anode erosion is unusual. Laser operation with brass electrodes can result in an insulating layer of metal fluorides being built up very gradually on portions of the anode. Applicants have discovered that the extent of the fluoride buildup is related to the lead content of the brass anode. For example, an anode comprised of C26,000 brass having less than 1% lead does not produce a significant fluoride layer. However, an anode comprised of C36,000 brass with a 3 to 4% lead content produces a relatively uniform fluoride layer covering the entire discharge surface at a thickness of about 100 to 200 microns. In the regions covered by the fluoride layer, discharge current flows through tiny holes which typically tend to have approximately circular cross sections with diameters of about 20 to 150 microns. The surfaces covered by the fluoride layer do not suffer substantial further erosion, but if the fluoride layer is not uniform the erosion rate is increased on the non-covered discharge surfaces especially if the non-covered surface area decreases. There appears to be some erosion on the covered surfaces at the locations of the tiny holes, but this erosion is at least one, and possible two orders of magnitude less than that of the base metal.

Erosion Rate

In embodiments of this invention electrodes are comprised of two different materials having erosion rates different from each other. The relatively lower erosion rate material is located at the location of the discharge surface of the electrode which is a long thin surface, for example about 3.5 mm×545 mm. The higher erosion rate material is located along both of the longer sides of the discharge region.

When Applicants, in this specification and the claims, are comparing erosion rates of two materials used in a particular electrode the comparison is based on the materials being subjected to equivalent conditions such as electric fields and currents. The reader should understand that if the low erosion material is subjected to higher fields and discharge currents than the lower erosion material the actual rate of erosion during certain time periods could be higher for the lower erosion material than the higher erosion material. With the electrode designs described herein, however, any such greater erosion of the lower erosion material would reduce slightly the electric field in the region of the lower rate of erosion material relative to the electric fields of the surrounding higher rate of erosion material.

However, any shift in the electric field pattern from the desired electric field pattern toward the surrounding higher rate of erosion material would increase the rate of erosion of the surrounding material which will tend to restore the desired electric field pattern. Therefore, with the electrode designs described herein substantial erosion can occur over may billions of pulses without any substantial change in the electric field patterns and discharge current profiles.

Sputtered Metal Ions

In order to create a good laser active media, a uniform discharge plasma must be created between the electrodes. Initially the gas in the gap between the electrodes is pre-ionized with pre-ionizer 12 shown in FIG. 1. As the voltage builds up on the electrodes ion sputtering produces plasma in the regions close to the electrode surfaces. Metal atoms sputtered from the electrodes are mostly in vapor form and a substantial portion of the metal atoms are ionized and help form a positive ion cathode "fall" region immediately adjacent to the surface of the cathode creating an extremely large electric field which contributes to the flow of electrons from the cathode and also accelerates electrons leaving the cathode. This process applies first to cathode 84 during the first portion of each pulse. However, because the polarity of the electrodes switch about half-way through the pulse, as shown in FIG. 4B, this effect also occurs at anode 83 which at that time functions as a cathode (i.e., the negative electrode). Both during and after the pulse the metal ions may be attracted back to the electrodes depending on the rapidly changing electric field conditions, but many are blown away by the circulating laser gas because some of the ejected electrode material is transported beyond the gas flow boundary layer. Applicants have discovered that substantial sputtering of copper from the anode is produced by negative fluorine ions during the first portion of each discharge when the anode is highly positively charged.

Fluoride Layer on Brass Electrode

Applicants have performed extensive testing of various electrode materials in attempts to improve electrode lifetime beyond 10 to 13 billion pulses. With brass electrodes, erosion at the discharge surface of the anode is normally the principal limit of electrode lifetime. Erosion changes the electrode shape from its optimum shape and as a consequence laser beam quality is adversely affected. Applicants' tests with these brass electrodes have shown that the longest lifetime is obtained when materials are used which produce uniform, stable fluoride layers on the discharge surface of the anode. In particular, in one example an anode comprised of C36,000 brass (61.5% copper, 35.5% zinc and 3% lead) produced 13 billion pulses with no degradation in laser performance. (A typical useful operating lifetime for these electrodes is about 5 to 6 billion pulses.) Examination of that anode after the 13 billion pulses revealed a fluoride layer about 100 microns thick covering all of the discharge surface except for about 2 cm long region. This uncovered region faced a portion of the cathode which was severely eroded. Applicants suspect that the erosion of the cathode in this severely eroded region created very high fields which produced very hot discharges which burned off the 2 cm missing section of the anode which lead to the end of life for the cathodes at 13 billion pulses. The fluoride layer is comprised mostly of copper and zinc fluorides but appears to contain other material from the anode including lead. Applicants' measurement of the electrical resistance of the layer confirms it is highly insulating, resistance measurements showing infinity with a hand held ohmmeter.

The insulating layer contains thousands of tiny holes with widths of from about 20 to 150 microns which bottom out on the metal surface of the anode. The holes are spaced at about 20 to 30 holes per square mm on the discharge surface of the anode. The total number of holes in the 3.5 mm×545 mm discharge surface was estimated by Applicants to be about 50,000, and the holes represent about 5% to 10% of the discharge surface area. The other 90% to 95% of the discharge area is comprised of an insulating, dielectric material that can repel negatively charged fluorine ions due to rapid accumulation of negative electronic surface charge.

Applicants have conducted tests with several other types of brass, such as for example C 26,000 brass (69.7% copper, 29.6% zinc and less than 0.7% lead) and have determined that the low lead brasses generally do not produce significant fluoride layers in the discharge region of the anode. Applicants' conclusion is that a lead concentration of greater than 1% is needed to produce stable fluoride layers on the anode.

First Preferred Embodiment

Figure 5:
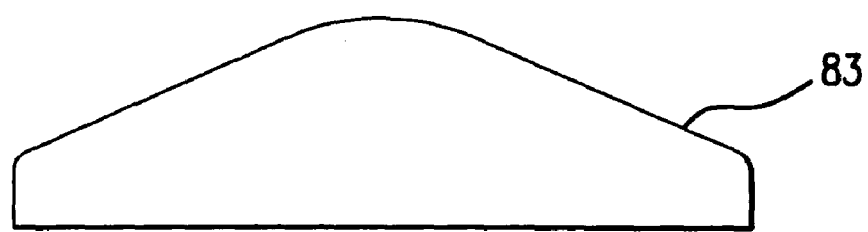
FIG. 5 is a cross section drawing of a prior art anode.
Figure 6:
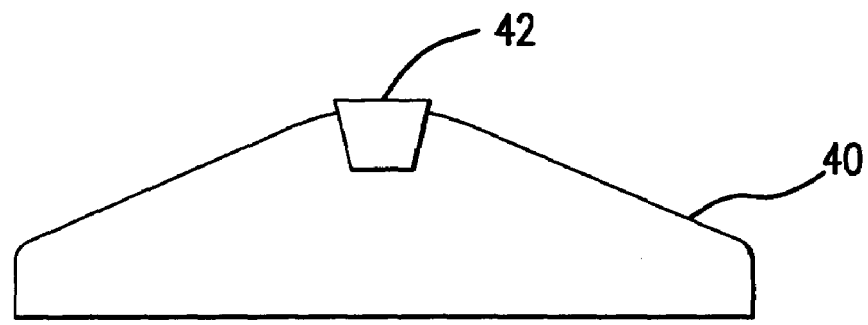
FIGS. 6, 6A, 7A–7E, 9 and 10A show preferred anode cross sections.

A first preferred embodiment of the present invention is a gas discharge laser such as KrF, ArF or $F_2$ having an elongated anode with the cross section shown in FIG. 6. The anode is comprised of two types of brass, the main body 40 of the anode 83 in C26000 brass (having a lead content of less than 1%) which is 600 mm long. This anode is a modified version of a prior art anode which has been used extensively in these gas discharge lasers. The prior art 83 anode has a cross section as shown in FIG. 5. The width at the bottom is 1.2 inches. The height to the center tip is 0.380 inch. The tip has a radius of 0.5 inch. The shoulder height from the bottom surface is 0.13 inch. The slanted sides are flat planes at an angle of 27.67 degrees with the bottom surface. Applicants have proven with many laser-years of operation that this general anode shape produces excellent electric field properties and excellent discharge performance along with very good laser gas flow compatibility. In the improved electrode shown in FIG. 6, a trench-shaped cavity is cut into the top surface of anode 83. The cavity is 545 mm long, 3 mm wide at the top, 2.5 mm deep and 1.7 mm wide at the bottom. The cavity is filled with a second brass part 42 comprising of c 36,000 brass (having a lead content of about 3 to 4%) which is cut to fit precisely in the cavity and extend above the surface by about 0.2 mm. The second brass part may be bonded in the cavity with Pb/Sn solder.

The anode is installed in a laser such as the one shown in FIG. 1 with, for example, a laser gas consisting of 1% krypton, 0.1% $F_2$ and the rest neon. A porous fluoride layer, comprising copper fluoride, zinc fluoride and lead fluoride, is created on the top surface of the second brass part 42 shown in FIG. 6 by operation of the laser for about 500 million pulses. At 2000 pulse per second this requires about 3 days. This porous insulating layer which develops, retards erosion of the discharge surfaces which allows the anode to maintain this extremely good shape for may billions of discharges. Electrons flow easily through the approximately 50,000 small holes which develop in the approximately 1,855 square millimeter area (3.5 mm×530 mm) of the lead fluoride layer. (This works out to about 30 holes per square millimeter.) On the other hand, individual fluorine ions, which are far more massive than the electrons, have a low probability of passing through the holes to the underlying brass with sufficient energy to cause sputtering. In one of the parents of this application, Applicants estimate that the present invention will permit at least a doubling or tripling of anode life, so that anode erosion no longer limits laser chamber life. Applicants' subsequent proof testing has supported these predictions. These tests are very time consuming since lasers available for electrode testing produce only about 2500 pulses per second. To accumulate 13 billion pulses at 2500 pulses per second requires a test period of about 60 days. As of the filing of this application a laser chamber with an anode with this initial shape shown in FIG.

6 had accumulated more than 13.5 billion pulses with no significant deterioration of laser pulse quality when it was removed for inspection. Aging of a prior art chamber with a prior art electrode as shown in FIG. 1, causes a reduction in laser efficiency and requires a gradual increase in the fluorine concentration in the laser gas or an increase in the normal discharge voltage to maintain a consistent pulse energy output. Normal practice is to set $F_2$ concentration for optimum beam quality and to increase operating voltage to compensate for reduced laser efficiency. Chamber lifetime is reached when laser beam quality deteriorates below acceptable levels or when the fluorine concentration and discharge voltage reach design limits.

Figure 6A:
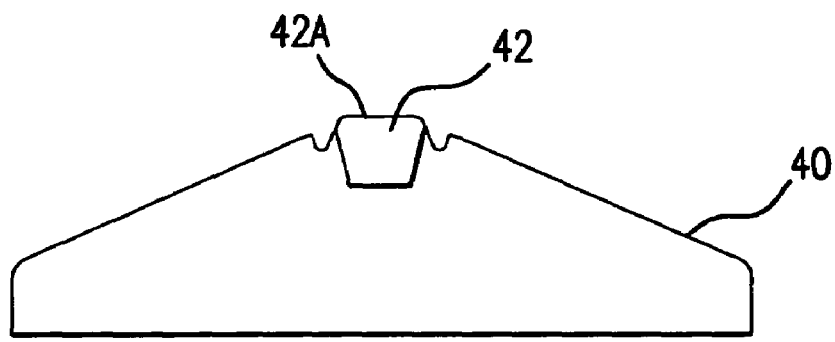
Figure 6B:
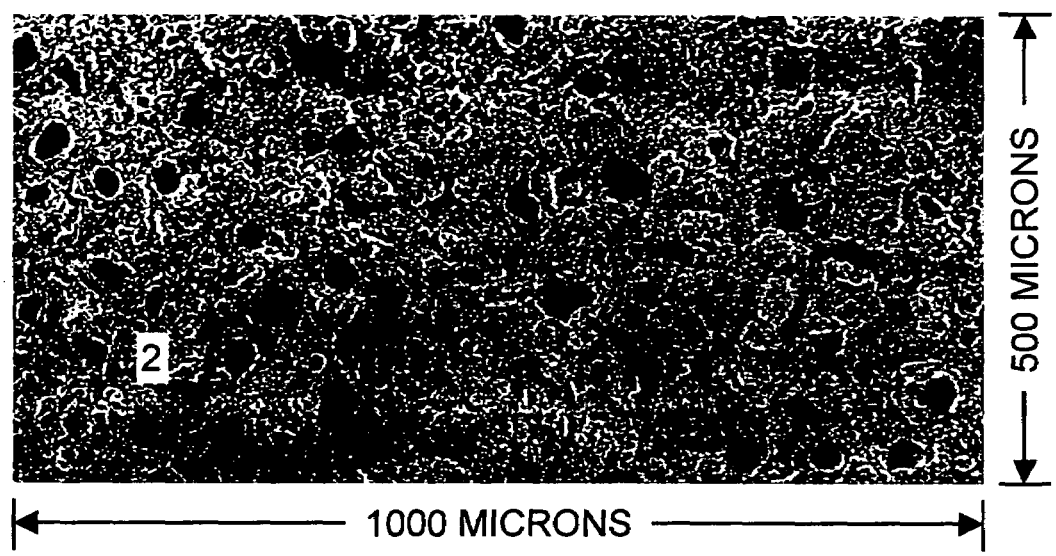
FIG. 6B shows a section of a fluoride covered anode.
Figure 6C:
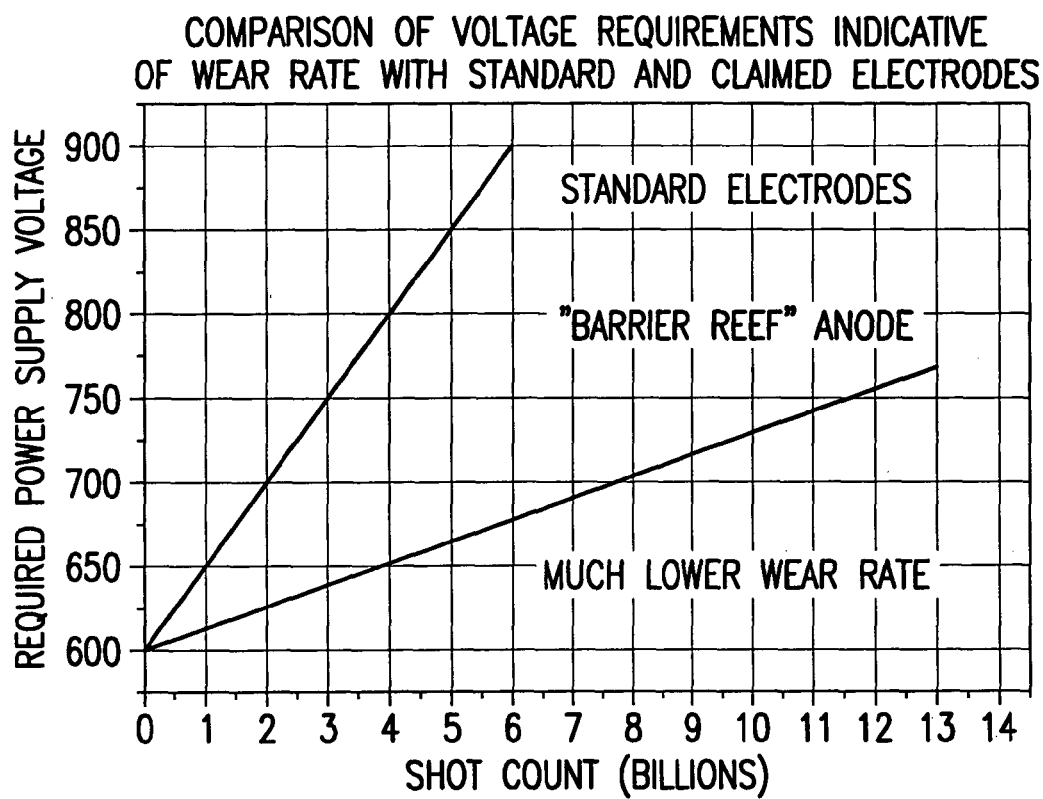
FIG. 6C is a graph indicating electrode wear rates.

FIG. 6C is a chart showing power supply voltage (which is approximately proportional to discharge voltage) as a function of chamber lifetime for the test chamber lifetime for the first prototype of the FIG. 6 anode. Also shown on FIG. 6C is a similar graph for a similar chamber with a prior art electrode of the type shown in FIG. 1. As indicated in FIG. 6C, the FIG. 6 prototype lifetime is already more than double the expected lifetime of the prior art anode and based on fluorine and voltage values, anode of this design are expected by Applicants to be capable of continued excellent performance at least to approximately 20 billion pulses. Since the reduction in efficiency evident in the FIG. 6C chart includes the effects of deterioration of parts other than the anode, applicants expect that the useful life of the anode itself may be capable of far in excess of 20 billion pulses. It may even be reasonable to recycle into new chambers anodes taken from a chamber which has reached its end of life.

During the life test of the electrode described above, the Applicants were not able to do a detailed examination of it. However, Applicants have periodically observed the electrodes by removing the LNP and looking at the electrode through the chamber window. The electrode can be observed while the electrodes are discharging at 2,500 Hz. A shield transparent to visible light and opaque to ultraviolet light protects Applicants' eyes. The discharges are described by Applicants as "beautiful" and perfect even after 13 billion pulses. The discharge surface appears basically unchanged since the early formation of a porous fluoride layer at about 500 million pulses. A very shallow trench in the C26000 brass portion sides as shown in FIG. 6A. The protective porous fluoride coating built up on the surface of part 42 is shown at 42A in FIG. 6A. There is no insulating layer built up on the part 40 portion of the anode. Therefore, if the discharge were to extend to the part 40, the discharge would erode a trench at the edge of part 40 which would stop the discharge from that region. Therefore, discharges are limited to the part 42 portion of the anode.

Figure 6D:
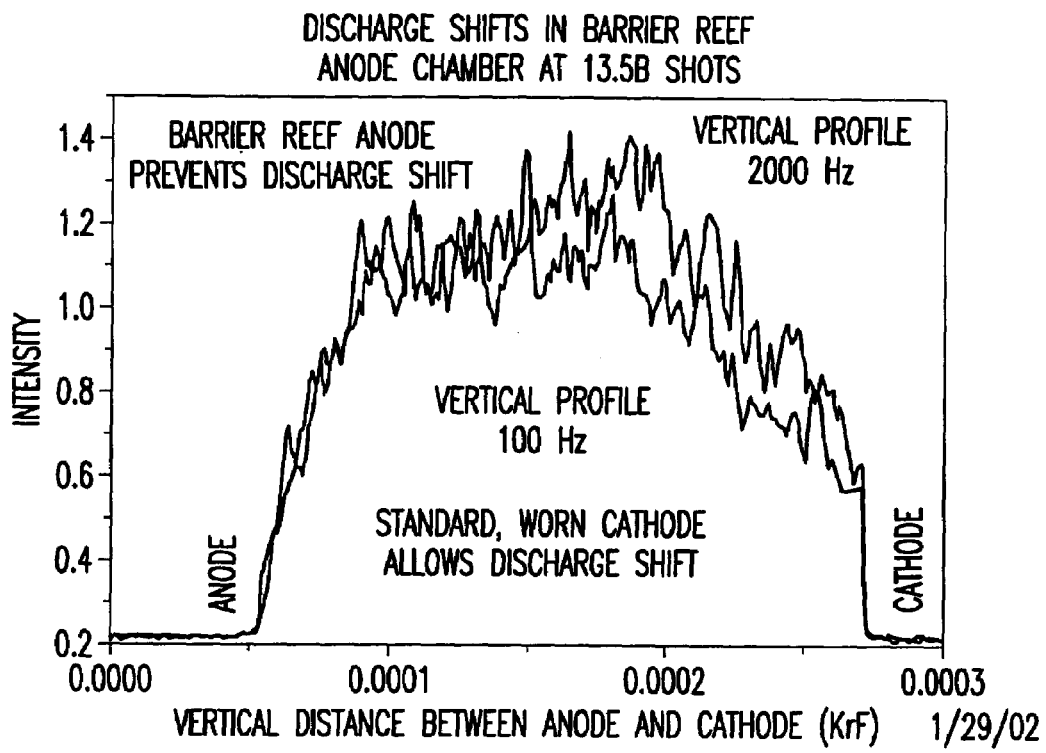
FIG. 6D illustrates discharger shift prevention according to the invention.
Figure 6E:
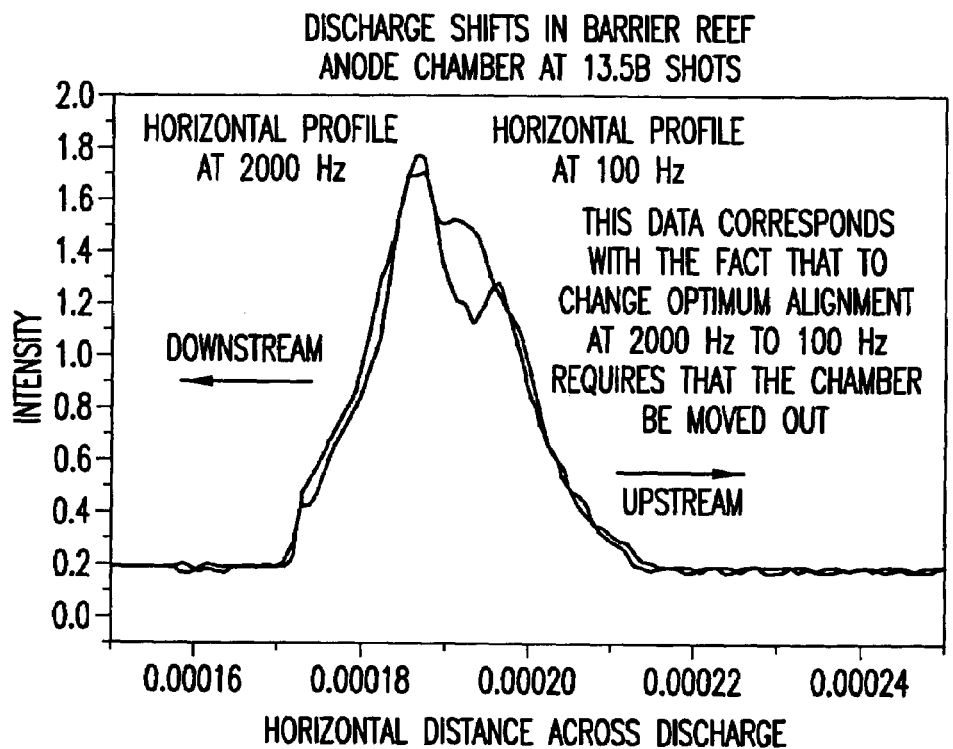
FIG. 6E compares horizontal profiles of discharge shift.

FIG. 6B is a copy of a photograph showing a section of the discharge surface of the prototype anode discussed in detail above. The photograph was taken soon after the anode had been removed from the chamber. The photograph shows the 3.5 mm wide discharge surface covered with the porous fluoride insulating surface. Also evident on the photograph are two solder seems. The photograph shows some accumulation of fluoride material on part 1 on the downstream side of the electrode. This accumulation is very thin and has no effect on electrode performance. FIG. 6D illustrates discharger shift prevention according to the invention FIG. 6E, compares horizontal profiles of discharge shift.

Importance of Lead

Applicants' tests have demonstrated the great advantages of a small amount of lead content in the copper based electrode material for creating a good stable porous fluoride layer on the discharge surface of the anode. The C36000 brass is a three-phase alloy comprising alpha and beta phases of copper-zinc and separate pure lead clusters. Lead atoms on the surface form fluorides as a result of contact with the fluorine in the laser gas. Applicants suspect that the lead fluoride clusters form nucleation sites on which copper and zinc fluorides accumulate. Lead fluoride is an extremely stable compound, much more stable than copper fluoride and zinc fluoride. Applicants do not have a good explanation as to why the may thousands of small, approximately round holes develop and persist, but they clearly do and they permit approximately 2.5 joules of electric energy to flow through them on each of billions of pulses with greatly reduced anode erosion.

Applicants have shown that excellent performance is achieved with the lead context at about 3–4 percent. A lead content of less than 1% does not produce a stable fluoride layer. Applicants expect good results with the lead content up to about 8 percent but do not at this time have good test data to confirm this expectation.

Second Preferred Embodiment

Figure 7A:
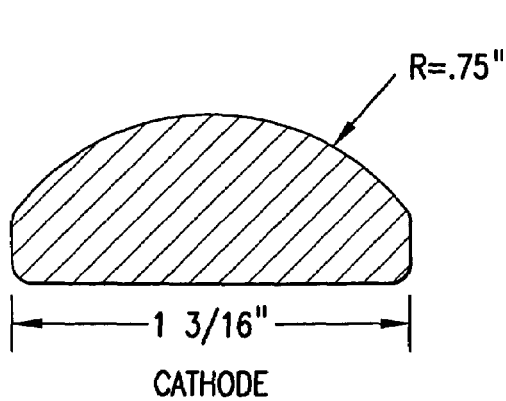
Figure 7B:
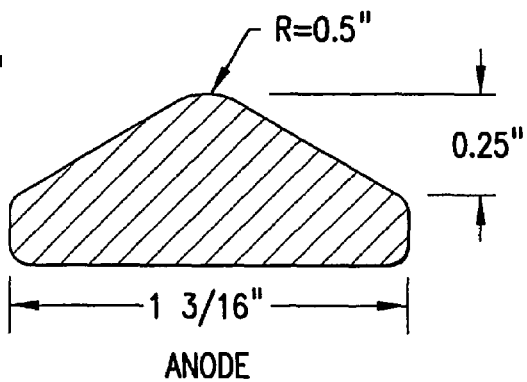
Figure 7C:
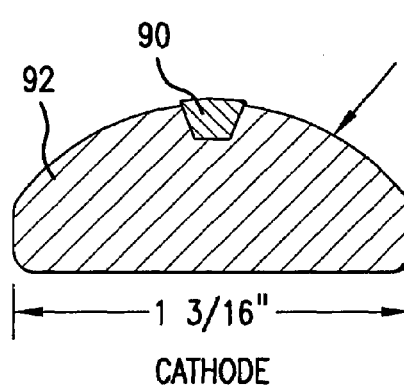
Figure 7D:
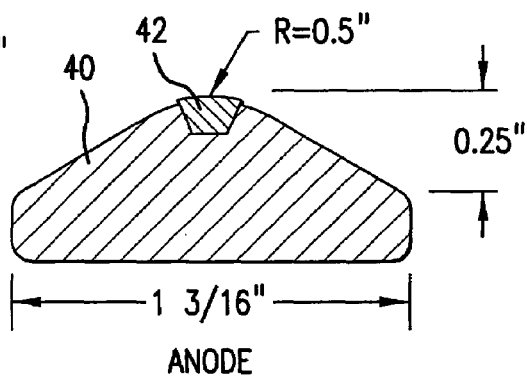

In a second-preferred embodiment of the present invention the anode is as described above and the cathode is similarly comprised of two materials, the first cathode material having a low cathode erosion rate positioned at the desired cathode discharge region and a second cathode material having a relatively higher cathode erosion rate positioned along two long sides of the first cathode material. Applicants have determined through several years of experimenting with brass electrodes that C36000 brass erodes about twice as fast as C26000 brass when used as cathode electrodes in fluorine containing gas discharge lasers. Cross sections of the cathode and anode in this embodiment are shown in FIGS. 7C and 7D respectively. This compares with the single material cathode and anode designs shown in FIGS. 7A and 7B which have been initialized previously in laser chambers designed and built by applicants and their fellow workers.

In the cathode the first material 90 located at the desired cathode discharge region is C260000 brass and the second 92 comprises the remainder of the electrode. When used as a cathode neither of these brasses form the porous insulating layer described above; however, the C26000 brass erodes at a rate of about one-half the rate of erosion of the C36000 brass. Therefore, any tendency of the discharge to spread onto the C36000 portion of the cathode will rapidly erode away the C36000 brass in the region of the spread which stops the spread. As explained above, for the anode the first material 42 at the location of the discharge region is C36000 brass and the remainder 40 of the anode is C26000 brass.

Variation in Annealing

Applicants have determined through experiments that annealing of the brass electrode material can substantially effect cathode erosion rate. In general Applicants have discovered that erosion rate is roughly inversely proportional to grain size over a large range of grain sizes. Since annealing reduces grain size, cathode erosion can be reduced by annealing the material. Therefore, an alternative cathode design would utilize annealed brass as the first material 90 and non-annealed brass as the second material 92. Preferably, sufficient annealing should be provided to reduce the grain size of the second material to about ¼ the grain size of the first material, for example, 54 microns for the first material and 13 for the second material.

Anodized Layer on Discharge Surface

A cross-section of an anode of a second preferred embodiment is shown in FIG. 7. Porous layer of insulating material 46 such as is placed over the discharge surface of a prior art anode before the anode is assembled in the laser chamber. The base 44 anode is C26000 brass which contains less than 1% lead. Therefore, as in the above no insulating layer will be created by any discharge that extends beyond the limit porous layer 46 and in fact any discharge extending to that region will tend to erode the C26000 brass terminating the discharge in that region and confining discharges to porous insulating surface 46. A preferred porous insulating surface can be provided using an anodizing process such as that discussed with respect to the next two embodiments.

Figure 7E:
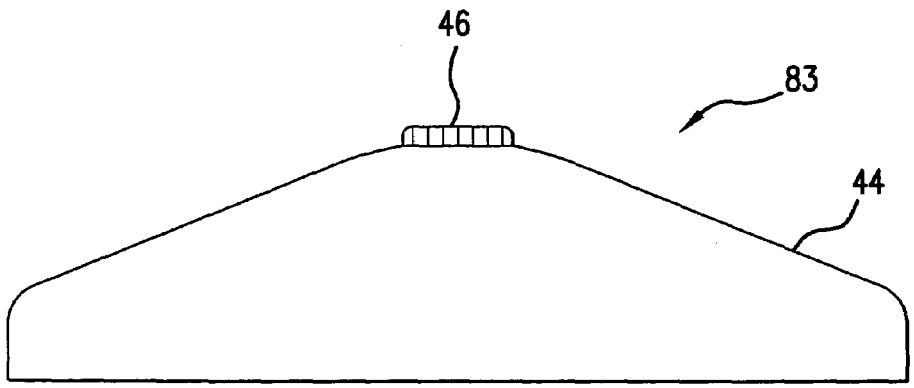

The porous oxide grows on aluminum in a process called anodization. High purity aluminum foil is mounted on the brass electrode. The brass electrode serves as an anode in an electrochemical cell. Generally, the purpose of the anodization is to produce a uniform protected alumina film on the anode. Using appropriate electrolytes and working voltage, the etching leads to production of the self organized porous structure. Holes with diameters from 10 to several hundred microns can be produced by varying the parameters of the anodization process. The thickness of the layer can be up to several hundred microns, but a thickness of about 100 to 1000 microns is preferred for the present application. This layer can be applied as layer 46 as shown in FIG. 7E. An alternative approach is to utilize aluminum for the electrode base material instead of brass. This simplifies the anodization process.

Text Results with Anodized Strips

Applicants experiments with the anodized alumina on brass electrodes indicates that in the environment of high voltage discharges with $F_2$ gas the oxygen in the anodized aluminum is replaced by fluoride laser similar to the porous layer which forms on the C36000 brass electrodes. Therefore Applicants believe that this anodized aluminum surface should produce an excellent very long life discharge surface material. Preferably, the material on both sides of the 3.5 mm wide discharge region should not be anodized so that it will erode at any attempt of the discharge region to widen beyond the desired 3.5 mm. Since bare aluminum as an anode in lasers is known by Applicants to erode at a rate about twice as fast as C26000 bras anodes, aluminum electrodes treated with an anodized 3.5 mm wide strip should make an excellent very inexpensive anode.

Porous Alumina on C36000 Brass Insert

Figure 9:
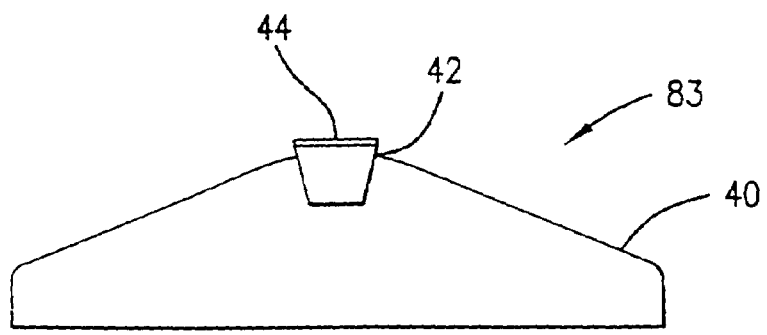

In a third preferred embodiment as shown in FIG. 9, the top surface 44 of part 42 which is C36000 brass shown in FIG. 6 is coated with the porous alumina before part 42 is soldered into the cavity of part 40 which is C26000 brass. In this embodiment, the C36000 brass will form a protective fluoride layer in a section if the porous alumina erodes away.

Plasma Sprayed Composite Coating

In another preferred embodiment a protective coating is sprayed on the anode in the region of the discharge. A preferred technique is to use a standard spray torch (as available from Hobart Torch, Inc.) for providing an alumina coating. Preferably conductive metal particles are mixed with 99% alumina. The metal percentage preferably is between 5% and 50%. A portion of about 25% is recommended. Metal powder could be Cu, Ni, Al, PA, or Mg. This technique could also be used to coat the discharge surface of the cathode. Preferred base electrode materials are C36000 or C26000 brass.

Another technique is to texture the discharge surface of a prior art brass electrode, then plasma spray the surface with an insulating coating such as alumina, then grind off enough of the coating to expose the high portions of the underlying brass. Texturing could be by machine, knurl, or abrasive blast. Coatings could be CVD, $Al_2O_3$, AlN, MgO, MgF or CaF.

Tiny Insulating Particles

Figure 10A:
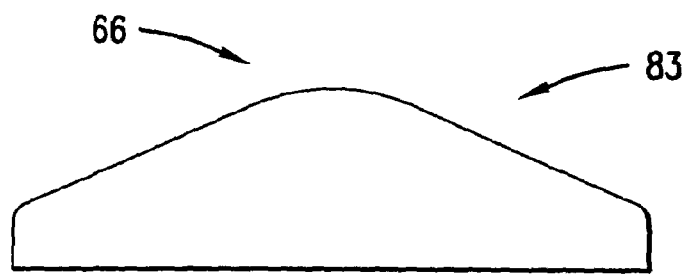
Figure 10B:
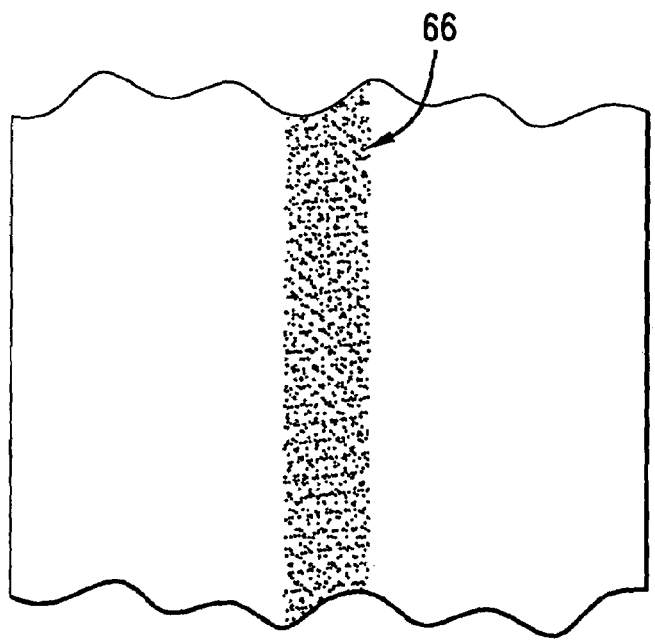
FIG. 10B is a top view of the FIG. 10A anode.

In a fourth preferred embodiment, tiny insulating particles 66 about the shape of grains of sand with dimensions of about 100 to 300 microns are braised to the discharge surface of a prior art brass electrode having the cross section shape shown in FIGS. 10A and 10B. In this embodiment, the discharge width is 3.5 mm. Preferably, the particles cover about 95% of the surface area of the cover about 95% of the surface area of the discharge surface as indicated in FIG. 10B which shows a top view of section of the anode.

Figure 8A:
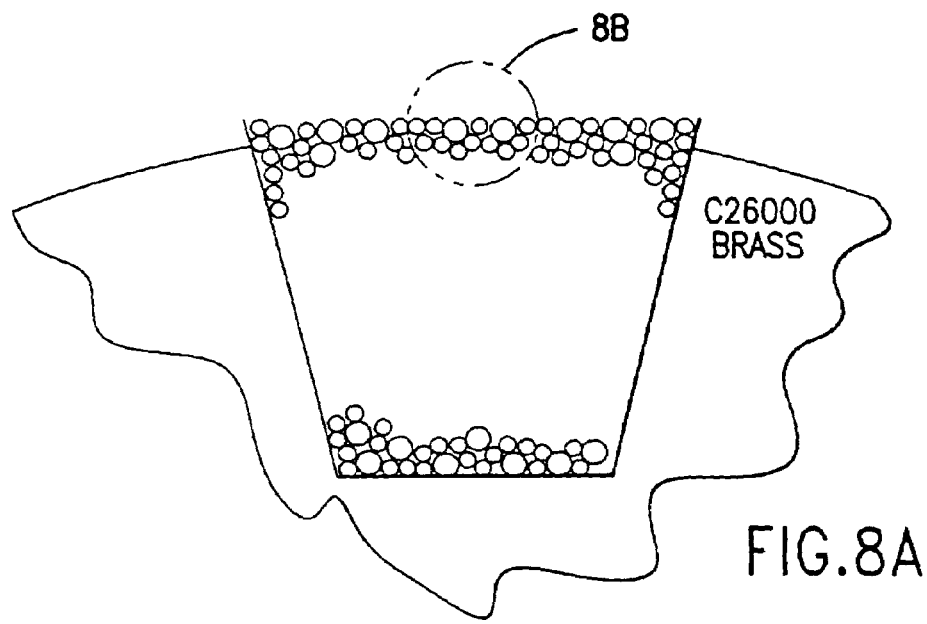
FIGS. 8A and 8B show a preferred embodiment of the present invention.
Figure 8B:
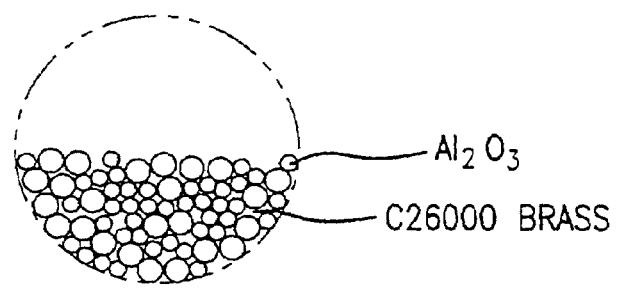

In a similar embodiment the tiny insulating particles such as $Al_2O_3$ are mixed with molten brass such as C26000 brass and the mixture are molded into the shape of part 42 as shown in FIG. 6. The resulting part is then machined to fit precisely into a part such as part 40 as shown in FIG. 6. Preferably, the particle sizes are 20 to 150 microns and the particle should constitute about 80–90 percent of the volume of the mixture. After a few days of operation, the surface brass will sputter away leaving an insulator layer on the surface but the material will continue to be conductive below the surface. FIGS. 8A and 8B are drawings showing the electrode surface after the surface brass has been sputtered away. The particles should be of a material which is stable at the melting point of brass and resistant to fluorine chemical reaction. Good choices are $Al_2O_3$, $CaF_2$ and $MgF_2$. The composite shown in FIG. 8A could also be formed using powder metallurgy techniques such as hot or cold pressing.

Other Fluoride Layers

As explained above Applicants have produced an anode (with C26000 brass and C36000 brass discharge insert) providing an amazing discharge laser lifetime extension. This embodiment increases anode lifetime so that it no longer contributes to chamber lifetime. Other components such as blower bearings now determine chamber lifetime. In the event these other components are in the future improved to extend their lifetime then even further improvement in the anode lifetime may be called for. Confirming whether or not a change in electrode design improves lifetime is a difficult expensive task since the only real proof of improved lifetime is lifetime tests which require months of operation of expensive lasers.

Applicants believe that it is probable that there are alloys other than the combination of C26000 and C36000 that would produce anodes even superior to the ones described above. Also, it is probably possible to create better porous insulating layers with different gas mixtures in lieu of the operating gas mixtures for the lasers in which the electrode will be used. Therefore an embodiment of the present invention is a special technique for creating passivation layers on gas discharge laser electrodes.

Electrode Passivation Layer Techniques

A fifth preferred embodiment of the present invention requires a construction of a special chamber for electrode passivation. Preferably this chamber may be a used or modified laser chamber specially adapted for producing electrodes with passification layers. Alternatively, a larger chamber could be provided with facilities to passivate several electrodes simultaneously. To determine if there are better alloy combinations than those disclosed above, experiments with alloys of varying combinations of elements should be conducted. For example, brass alloy combinations with various concentrations of copper, zinc and lead should be tested. Other elements such as tin should be tested. In one embodiment a single electrode with several segments, each with different alloy combinations could be tested to determine which produces the best passification layer. By tuning the composition of the electrode, microstructure (Pb segregation), chamber fluorine concentration, electrode potential, and current density, manipulation of the growth rate, thickness, and porosity of the passivating coating should be possible. Passivation can also be conducted inside, or outside the laser chamber using such a custom built apparatus. In the past, the porous fluoride insulating layer would sometimes form and sometimes not. By creating a custom alloy composition, experimenters can promote growth of the fluoride layer in a regular manner. This can be done by tuning both metallurgical factors and material composition (given constant current conditions). Applicants' test data so far has shown that Cu, Zn, and Pb are important to the formation and resulting structure of the passivating "reef" formed during fluorine attack. By increasing the Pb content of the alloy, reef formation can be promoted. This is likely due to increasing the number of nucleation sites for $PbF_2$ growth, what applicants believe to be the nucleation mechanism of the reef. Zn likely plays a roll in increasing the reef volume since it does not form vapor phase byproducts when attacked by fluorine, however it does fluoridize preferentially to Cu. Chemical analysis of the reef demonstrate that the reef consists of mostly Cu and Zn. To be more specific, $CuF_2$, $ZnF_2$, and nucleation sites of $PbF_4$. Since Sn forms many stable vapor phases fluorides, we can likely tune reef porosity (electrical impedance) by altering the Sn content in the parent alloy. In addition, reef formation kinetics may be altered by changing the metal grain structure via annealing. Applicants have shown that during annealing Pb segregates in high lead Cu alloys, likely creating bigger nucleation sites for the reef. There will be an interplay with the parent material grain size, Pb content, and annealing state on the growth of the passivating reef. By using a statistical optimization software package, passivating reef volume, porosity, and surface coverage of the anode could be optimized. The trade off here is electrical impedance of the passivating layer vs. corrosion protection. In addition, this impedance may impact growth of the reef since F-migration through the coating regulates growth rates at least during the early stage of reef formation. Applicants have observed this in experiments and also know that current density (higher, the better) will also influence the reef formation.

Plasma anodization process variables include:
A. Pb content: Reef Thickness, nucleation/coverage, and morphology (roughness)
B. Sn content: Reef Porosity
C. Zn content: Reef thickness and morphology.
D. Cu content: Reef thickness
E. Parent Material Grain size: Reef morphology, nucleation/coverage
F. Ion current: Higher, thicker the reef
G. System Voltage
H. Photon Production, enhances fluoride generation
I. F2 concentration: relationship needs to be determined
J. Parent metal surface roughness (Nucleation depends on absorbed F2)

Use of Alumina to Promote Reef Formation

Applicant has shown that patterns of alumina deposited on the discharge surface of anodes promotes the growth of an excellent porous passification. Applicants believe that the alumina presents nucleation sites from which the $COF_2$ layers grow. A preferred technique to put the alumina pattern on the discharge surface is as follows. The discharge surface (about 3.5 mm wide) of a copper electrode (C11000) was knurled to produce a knurl pattern of small (about 1.5 mm) raised regular parallelograms.

The surface was then coated with alumina using a plasma spray process. Then the discharge surface was ground down to expose about 90% of the underlying copper leaving about 10% of the surface coated with alumina in a parallelogram pattern. The electrode was then operated in a KrF laser and within about two days of operation (200,000,000 pulses) an excellent porous copper fluoride layer had formed over the discharge surface producing a well-patterned discharge. Applicants' estimate that the lifetime of electrode passivated with this process will have an extremely long lifetime in excess of ten billion pulses.

In addition to alumina, other materials such as $CaF_2$ or MgO could also be used instead of the $Al_2O_3$.

Plasma Electrodes

Figure 13A:
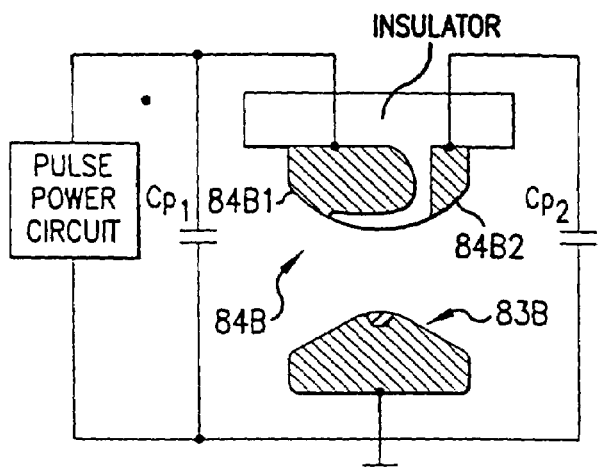
FIGS. 13A, 13B 13C and 14 describe plasma electrodes.
Figure 13B:
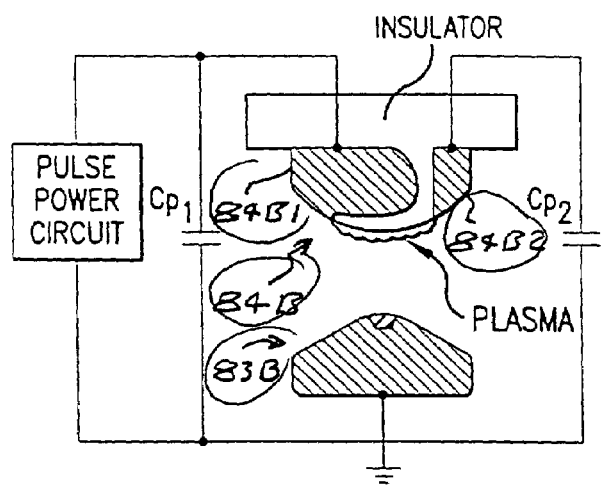
Figure 13C:
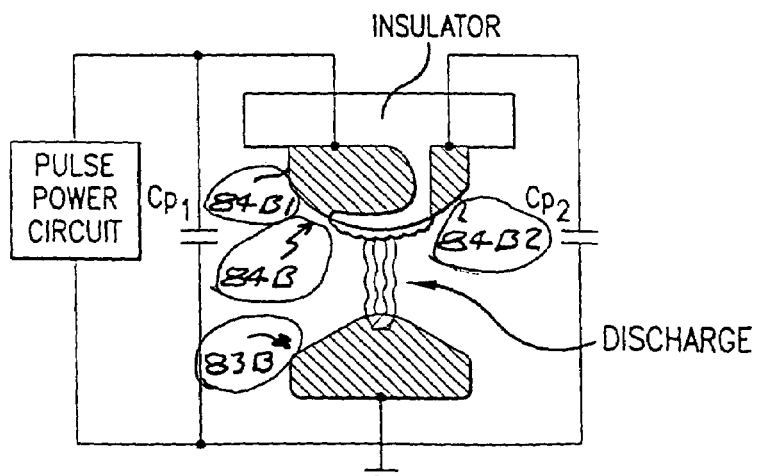
Figure 14:
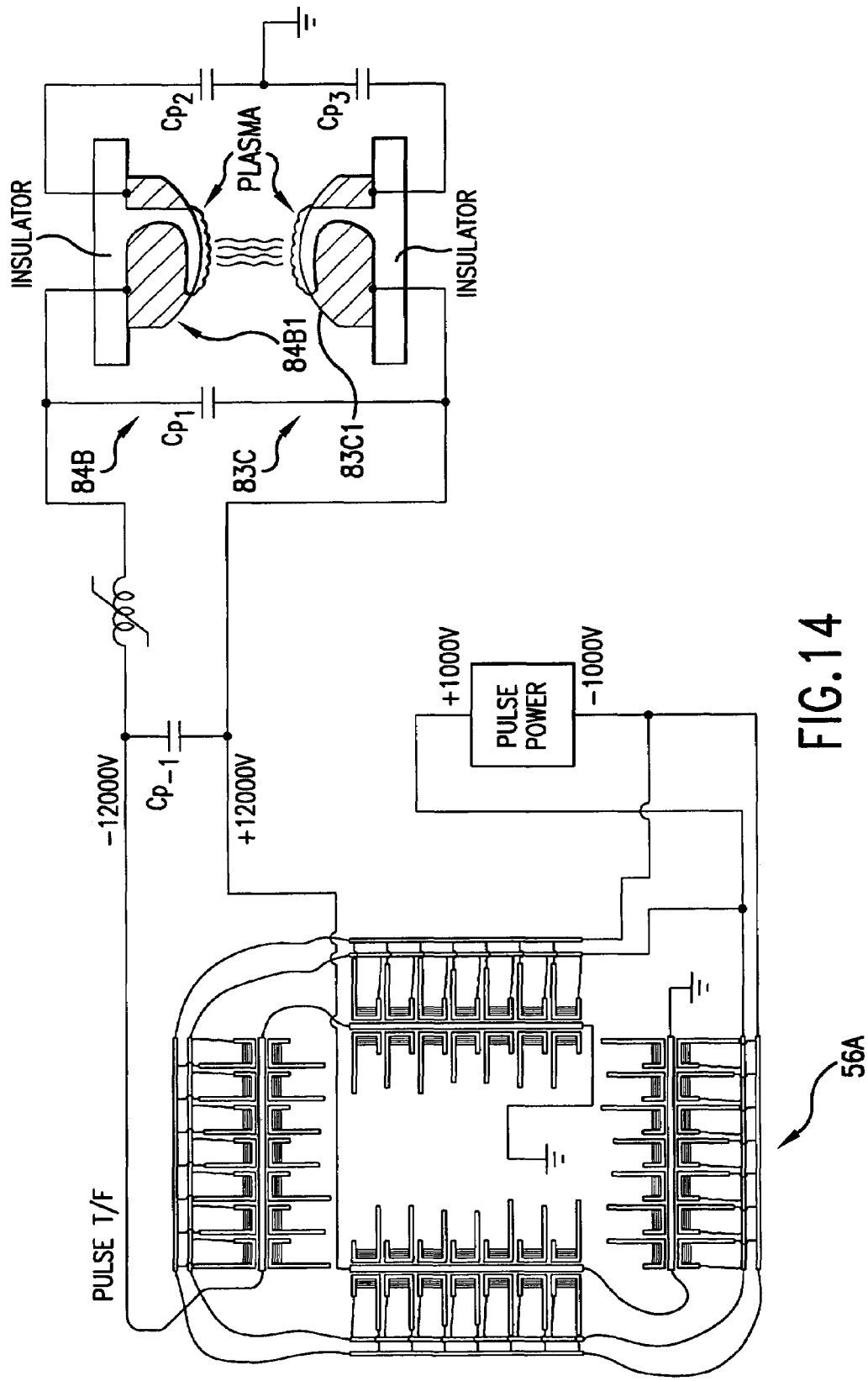

FIGS. 13A, B and C and FIG. 14 demonstrate embodiments of the present invention in which plasmas on the surface of an insulator serve as electrode discharge surfaces. Such electrodes are expected to exhibit virtually unlimited life in these laser chambers. FIGS. 13A, B and C show a plasma cathode. Both the cathode unit 84B and the anode unit 83B have the general shape of the electrodes shown in FIGS. 7A and B. However, the cathode 84B is divided in its long direction into two parts 84B1 and 84B2 which are separated by insulator 87, preferably alumina. Part 84B1 is connected to the high voltage side of capacitor bank $Cp_1$ which during typical discharges provides a 30 ns electrical pulse up to peak potentials of about 24,000 Volts. As the voltage on $Cp_1$ increases a plasma arc (also known as a corona discharge) will form on the lower side of cathode 84B as shown in FIG. 13B and electron flow through the plasma arc will charge capacitor bank $Cp_2$ which has a small capacitance of about 10% of the $Cp_1$ capacitor. When the potential on cathode 84B reaches a discharge potential in the range of about 20,000 volts the discharge (between cathode 84B and anode 83B) will begin as shown in FIG. 13C and will continue until both $Cp_1$ and $Cp_2$ are discharged as shown in FIG. 13C. In this embodiment the anode is of the type described above and shown in FIG. 7D.

FIG. 14 shows an embodiment in which both cathode 84B and anode 83C are designed as plasma electrodes. They have the shapes of the electrodes shown in FIGS. 7A and B but they each have alumina discharge surfaces. In this case pulse transformer 56A is the substantially same one as the one shown at 56 in FIG. 3 but is modified so that a high negative voltage is applied to the cathode part 84B1 and a high positive voltage is applied to 83C1.

Plasmas are generated in the surface of both electrodes, and as described above, discharge between the cathode and anode occurs when sufficient potential as developed between the two electrodes.

In both of these embodiments no pre-ionizer such as the one shown at 12 in FIG. 1 is needed since the plasmas on the surface of the electrodes produce sufficient ultraviolet radiation to pre-ionize the discharge region between the electrodes. The reader should note that special capacitor banks $Cp_2$ and $Cp_3$ may not be needed since parts 84B2 and 83C2 could provide self capacitance which could be sufficient to produce the plasmas on the surfaces of the two electrodes.

Figure 15:
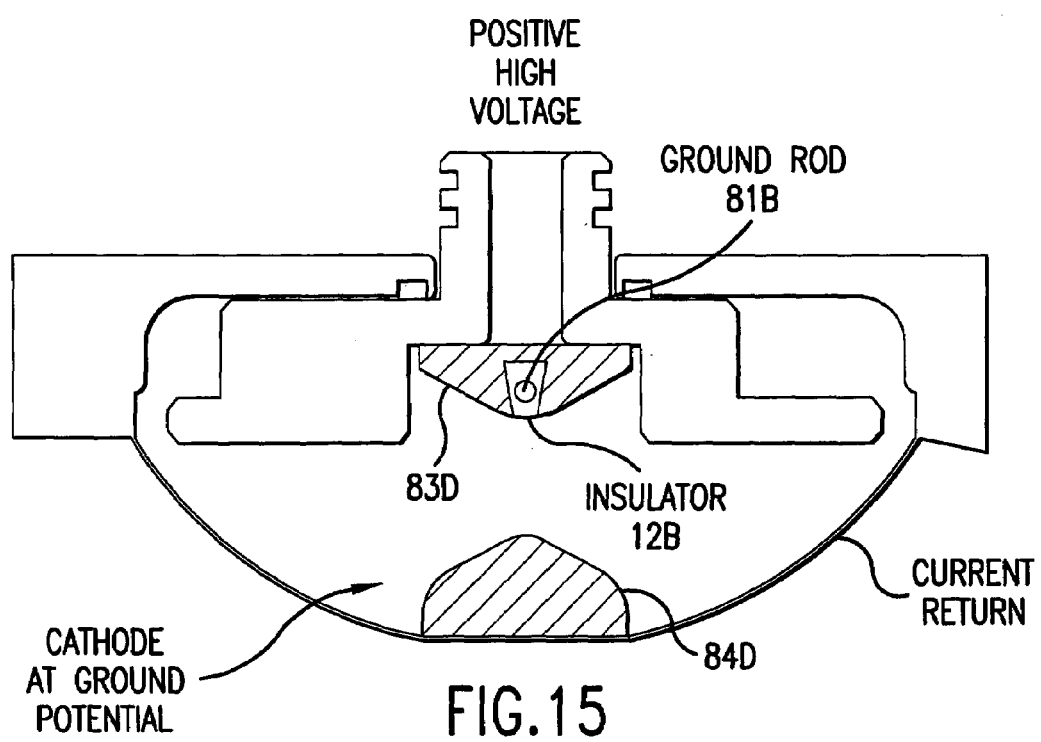
FIG. 15 also describes a plasma electrode.

FIG. 15 shows another version of the plasma electrode concept. Here the cathode 84D is at ground and the anode is energized with high voltage positive pulses. An insulator part 12B is located at the discharge region of the anode with a ground rod 81B inside. During each electrical pulse, a plasma will build up on the surface of the insulator part 81B permitting flow of electrons from the insulator portion of the cathode to the anode during electrical discharge. The corona region which develops on the surface of insulator 12B produces ultraviolet radiation which avoids the need for separate preionizer.

Figure 7F:
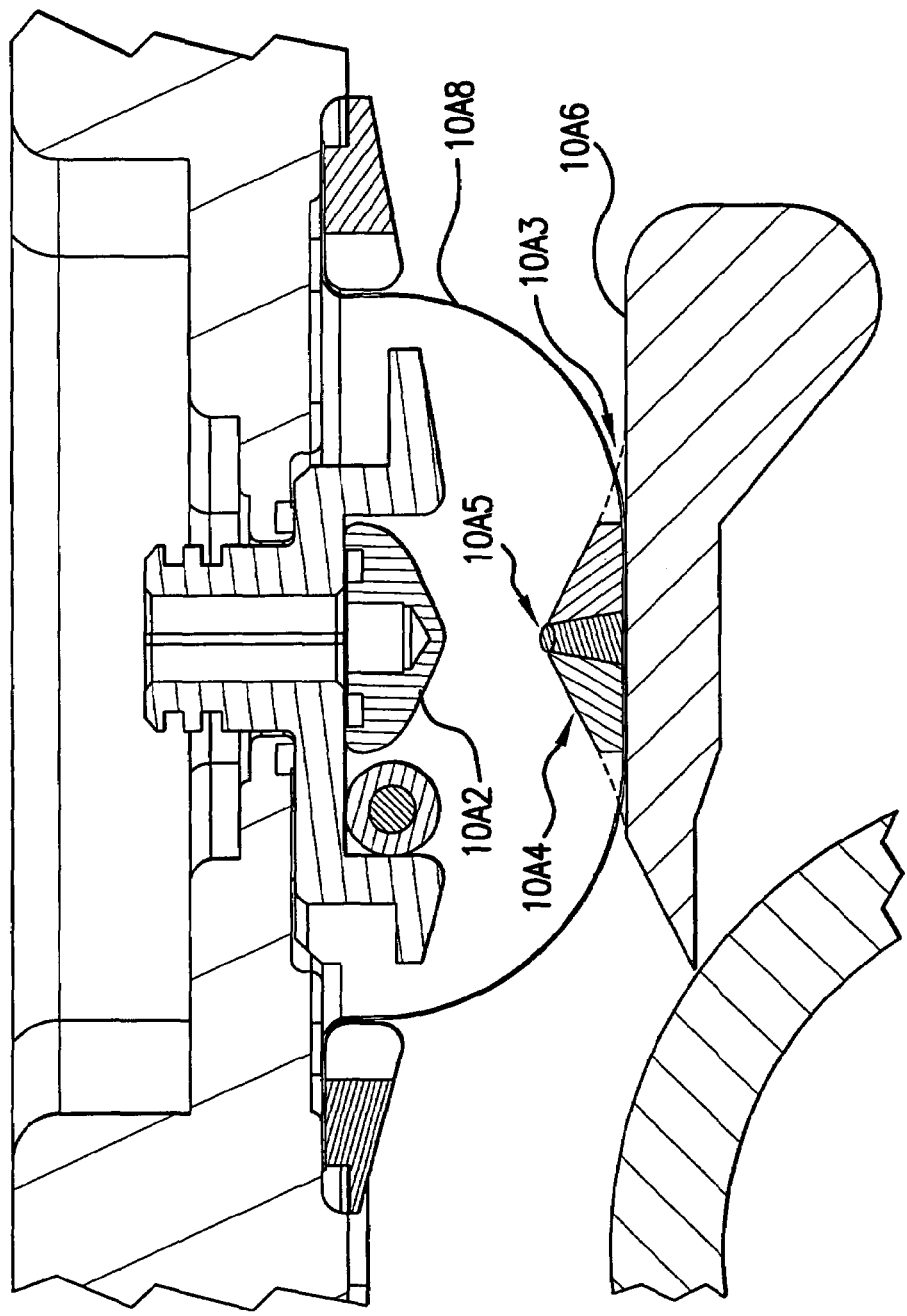
FIG. 7F shows an electrode configuration.

Blade Electrode with Porous Dielectric Discharge Surface and Dielectric Flow Spacers FIG. 7F shows another long-life electrode embodiment. In this case the electrode configuration consist of an electrically conducting element with a cross section having the shape of a dull blade 10A3 and flow-shaping dielectric spacers 10A5 positioned on both sides of the conducting element. The discharge surface of the blade element 10A3 is preferably covered with a porous insulating layer. This layer could be produced "in place" by choosing for blade element 10A3 a material (such as C36000 brass) which, in the presence of discharges in a $F_2$ laser gas, produces a porous insulating layer. Or a porous insulator layer could be deposited on the blade element using one of the techniques described above such as the anodizing process. A variation of the FIG. 7F design would be to extend the sides of the spacers as indicated by the dashed lines 10A3 in FIG. 7F. This further improves gas flow in the discharge region.

In a variation of this design a relatively thick insulating layer is deposited on the discharge surface of a metal electrode and many tiny holes are drilled in through the insulating layer to the conducting metal underneath the layer. This approach could be used either on the anode or the cathode or both. For the FIG. 7F electrode, insulating spacers are located along the sides of the discharge surface, but alternate approaches would be to use a conventional electrode as shown in FIG. 1 and coat the entire surface of the metal electrodes but drill holes only in the discharge surface. Still another variation would be to use the general shapes shown in FIG. 1 but apply the insulating layers only on the discharge surfaces then drill the tiny holes in the insulating surfaces. Preferably the holes are drilled with an excimer laser. Any attempt of the discharge to spread to the adjacent uncoated metal surface would gradually erode away the metal in the adjacent region and thus stop the spreading. The preferred hole cross-section major dimension (such as diameter for an approximately round hole) is in the range of several microns such as about 10 microns to about 150 microns with the best range within about 30 to 80 microns. If the holes are too large they can close up with fluoride or electron flow through the hole could become excessive which leads to excessive concentrated erosion and hot spots. If the holes are too small current flow through them is insufficient. Holes in the range of about 200 microns appear in some cases to develop a microscopic volcano-type appearance with excessive fluoride build-up around the hole which is undesirable. The preferred hole spacing in the discharge region is about 5 to 50 holes per square millimeter. The percent of surface over the discharge region constituting holes is about 5 to 10%.

Long-life Electrode Design with Reduced Acoustic Effects

Each discharge of the laser produces a shock wave, shock waves travel through the laser gas at approximately the speed of sound. At repetition rates of 4000 Hz the time between pulses is 0.25 milli-seconds. In that time interval shock waves travel about 5.8 cm. Applicants have discovered the importance of eliminating to the extent feasible reflecting surfaces located at distances equal to one half the distance traveled by the shock waves between pulses. The reason is that a shock wave from one discharge returning to the discharge region within the 30–50 ns of the next discharge will typically adversely affect the resulting beam quality. It is not feasible to completely eliminate all shock reflecting surfaces. Therefore, Applicants have developed several techniques of minimizing the adverse effects of the reflecting shock waves. One technique is to minimize symmetry associated with the reflecting shock waves in the long direction of the laser. This could mean that the shock wave at the front of the laser returns to the discharge region at different times than the wave at the rear of the chamber. Another technique is to design reflecting surfaces so that they disperse the shock wave at various angles with respect to the long direction of the electrodes.

Figure 7G:
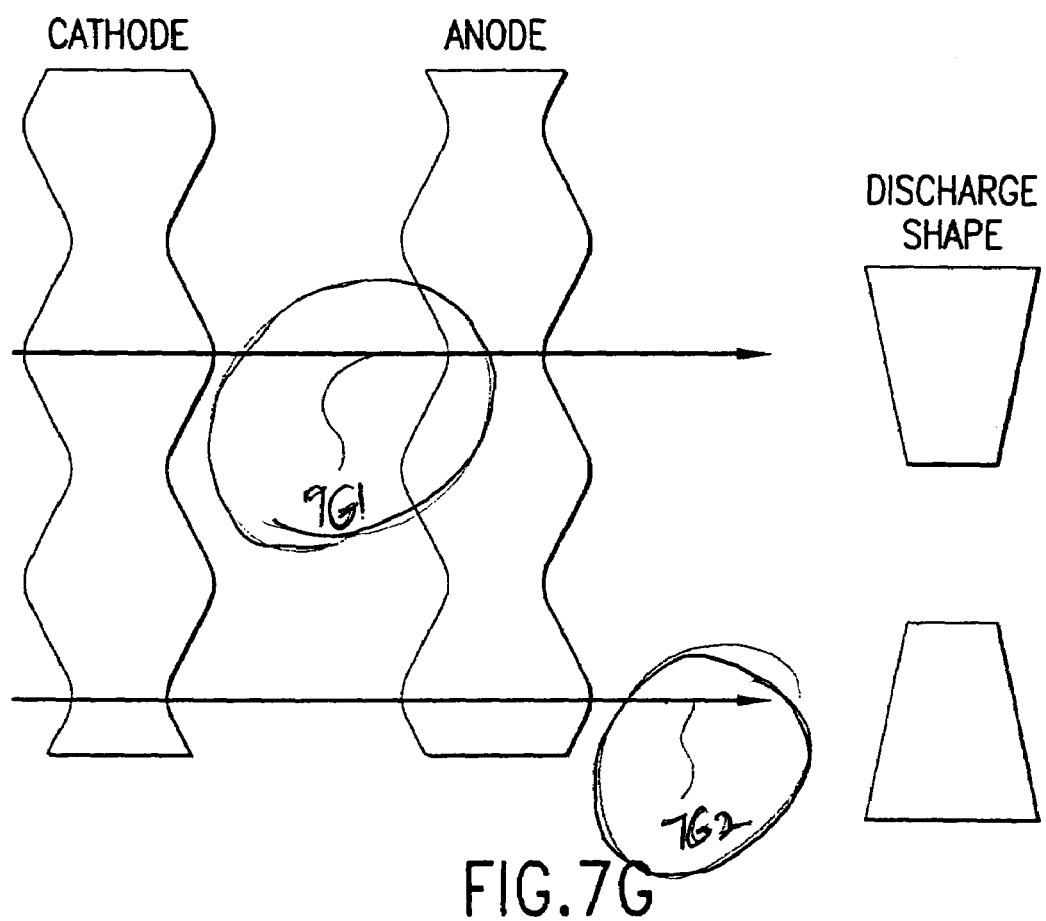
FIG. 7G shows electrodes shaped to provide a varying discharge width along the lengths of the electrodes.

Another approach is to provide a discharge shape which varies in the long direction of the discharge region. For example, FIG. 7G shows proposed discharge surfaces of a cathode and anode respectively. Arrow 7G1 points to a discharge shape at a first location in the discharge region and arrow 7G2 points to a second discharge shape in a second discharge region. Thus, the resulting reflecting shock wave from each discharge will be dispersed in time and thus its impact on the beam quality will be reduced. A similar technique is to slightly offset the anode with respect to the cathode so as to produce a discharge that deviates from vertical by a small angle such as about 5–10 degrees. This also has the effect of reducing the impact of the reflecting acoustic waves.

Solution to Excessive Electrode End Erosion

Applicants have discovered that end-of-life for nearly all electrode sets is due to electrode erosion occurring along the two inches at either one or both ends of the electrode sets. The excessive erosion usually occurs on both the anode and the cathode. Applicants believe that this higher than average erosion results at least in part from slightly higher than average electric fields at the ends of the electrodes. Another factor which could be responsible for the relatively higher rate of erosion at the ends of the electrodes is that the circulating gas velocity between the electrodes is slightly lower at the ends of the electrodes than in the central portion.

Applicants have developed several laser chamber improvements to remedy this situation. One solution is to provide additional slopes at the ends of the electrodes. Applicants' previous designs utilize a 0.75 inch radius at the ends of the electrodes. A more gradual slope beginning about two-inches from the ends of the electrodes reduces the field at the ends.

In another solution to the problem, either one or both of the electrodes are turned at both ends as shown in FIG. 16B so that the distance between the electrodes in the discharge region remains constant to both ends. In one embodiment one of the electrodes has the shape shown in FIG. 16B and the other one has the standard shape as shown in FIG. 16A. In another version both ends of both electrodes are turned as shown in FIG. 16B. Preferably the cathode and anode turn in opposite directions at each end of the chamber. Still another solution to the end erosion problem is to remove one or more of the current return "ribs" at each end of the electrodes. In prior art design current return ribs (which have the general whale-bone shape) as shown at 10A8 in FIG. 7F are distributed evenly along the entire length of the electrodes. In one prior art design the current return structures comprised 27 ribs spaced at 1-inch intervals. Applicants cut out ribs 2, 3 and 4 and 24, 25 and 26 in the end regions of the current return structure. This produced a significant improvement in energy distribution in the discharge region and is expected to substantially increase electrode life. Similar results could be obtained by eliminating feedthrough rods which conduct current from the pulse power system through the insulator to the cathode 84 as shows in FIG. 1. In typical prior art lasers there are about 15 feedthrough rods spaced at 1½-inch intervals along the length of the cathode. A preferred technique to reduce excess end erosion is to reduce by 1 to 3 the number of feedthrough rods at each end. A second advantage of reducing the feedthrough rods in these end regions is that the seals associated with these rods have a tendency to leak in some cases because of differential thermal expansion between the insulator and the chamber upper wall.

Tungsten Based Electrodes with Cold Trap

Tungsten is knows as an excellent electrode material for a great many applications; however, in the past it has been avoided as an electrode for gas discharge lasers containing fluorine. This is because tungsten and fluorine combine to form a gas, $WF_6$, which absorbs laser energy. Also, photo-dissociation of the $WF_6$ can result in tungsten plating out on chamber windows.

Embodiments of the present invention utilize tungsten, tungsten alloys or tungsten composites in the electrodes. For example, part 42 shows in FIG. 6 could be a tungsten composite with a very low rate of erosion. To avoid or minimize any adverse effects of $WF_6$, Applicants have added a $WF_6$ purification loop to the basic laser chamber design shown in FIG. 1. The prior art chamber extracts a small percentage of the circulating gas flow at the high-pressure side of blower (part 56) which passes through an electrostatic filter (not shown) where it is cleaned of metal fluoride particles. The cleaned gas flows from two sides of the filter to both laser chamber window housings to slightly pressurize the window region (relative to the discharge region) with clean gas thereby keeping debris laden gas away from the window. (For details see U.S. Pat. No. 5,018,162, incorporated by reference herein). Preferably the cold trap is located in the filter loop. Preferably, only a small portion (about 5–10%) of the filter flow is directed to the cold trap which is cooled to liquid nitrogen temperature. $WF_6$ condenses at a temperature of about 17° C. and is therefore completely removed from the portion of the gas flow passing through the filter. Preferably a heater is included in the cold trap so the $WF_6$ can be evaporated and removed from the chamber at the time of gas replacement.

Improved Pre-ionizers

Figure 2:
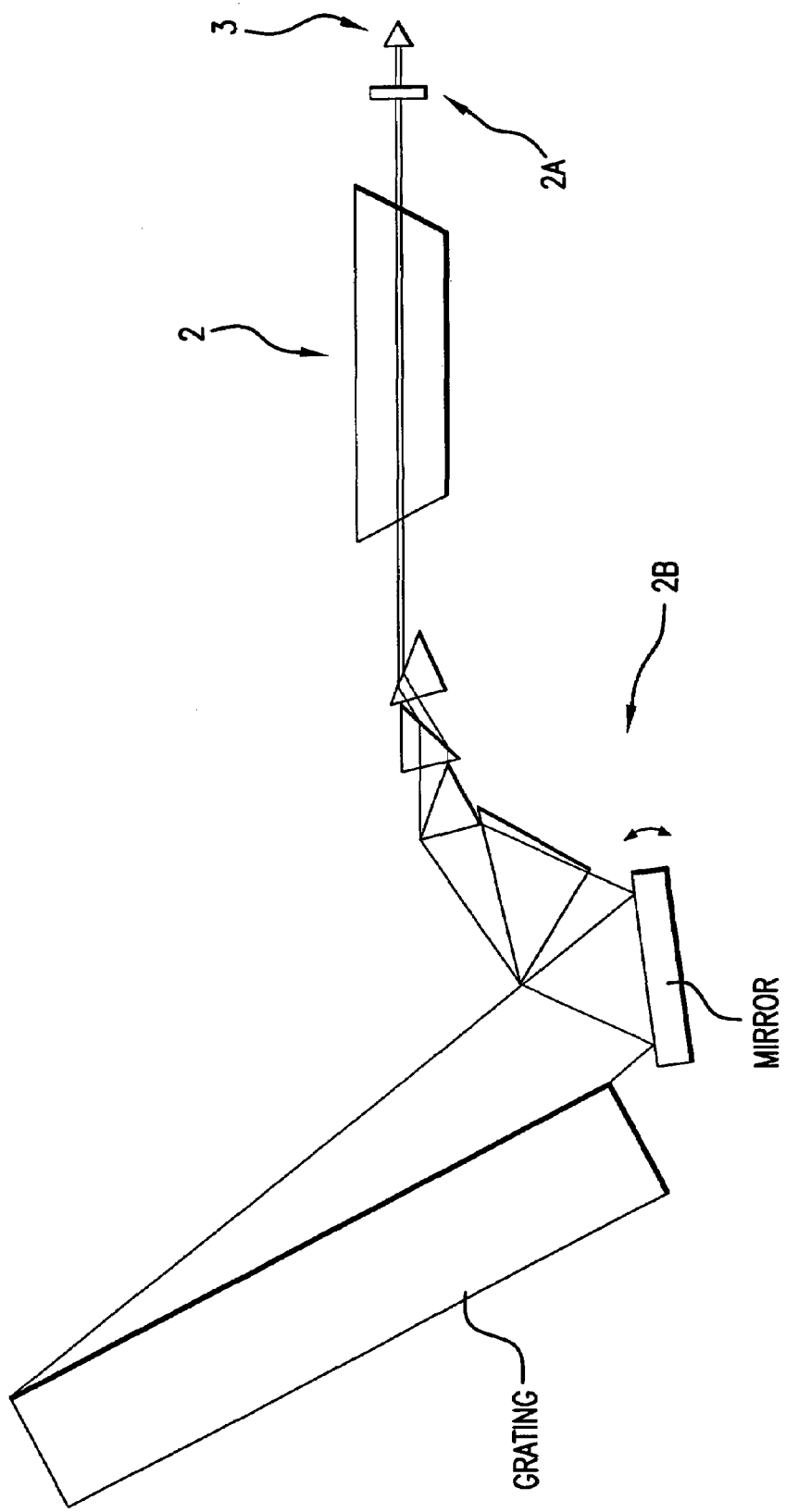
FIG. 2 shows other features of the prior art laser.

Prior art pre-ionizers used in gas discharge lasers of the types described above typically are basically one or two cylindrical alumina tubes (only one is used [shown as FIG. 12], in the FIG. 2 example) with a ground rod disposed along the axis of the tube (or tubes). A thin flexible conductor (not shown) called a shim in contact with and at the same potential as cathode 84 presses on the outside surface of the cylindrical tube. Near the beginning of each pulse a corona discharge is generated along the outside surface of the pre-ionizer tube which produces ultra violet light to pre-ionize the discharge region resulting in the consistent and predictable discharge between the electrodes. In the past Applicants have experienced some problems with poor contact between the shim and the surface of the tube.

In an embodiment of the present invention a conductive coating such as Pt, Cu, Ni or An is deposited permanently in a thin (about 1 mm wide) line along the approximately 50 cm length of the active part of the pre-ionize tube. A flexible conducting shim solidly connected to the cathode presses against the surface of the pre-ionizer tube in contact with the thin conductive coating. Preferably, the shim should be segmented into segments about 2 to 3 inches long to improve the mechanical contact between the shim and the conductive coating.

FIG. 17 shows this arrangement with cathode 83E, pre-ionizer 12, ground rod 12A, alumina tube 12B, conductive laser 12C, flexible conductive shim 12D and main insulator 13. The pre-ionizer tube is held in place by three positioning members (not shown here) as described in U.S. Pat. No. 5,771,258 incorporated by reference herein.

In an alternate design the conductor part 12D is fabricated as a part of the cathode 83E during the machining of cathode 83E so that cathode 83E and conductor 12D is a monolythic part. The shim could be machined very thinly (especially near its edge where it contacts the pre-ionizer tube 12) to give it some flexibility. Alternatively the edge of the conductor part 12D could be machined with a concave shape to match the surface of pre-ionize tube 12. In this case, preferably a flexible force is applied to the opposite side of tube 12 to hold it in compression against conductor part 12D.

Anode—Gas Shielded from $F_2$

Another embodiment of the present invention for providing a long life anode is shown in FIG. 18. In this case the anode is made of a porous sintered metal such as C26000 brass. For a KrF laser, a 1% Kr, 99% Ne mixture is forced through the centered anode so that the discharge surface us always protected by a layer of $F_2$ free gas. This avoids fluorine sputtering of the anode. Applicants have determined that a $F_2$ clean layer of about ¼ micron thick should be large enough to avoid fluorine sputtering. The addition of the small amount of krypton and neon will produce a reduction of $F_2$ concentration which will have to be made up with the addition of laser gas relatively rich in $F_2$ (such as 1.0% $F_2$ 99% Kr and 1.0% Ne) but this will create no problem because existing gas controls are already available to make up for the loss of $F_2$ through $F_2$ chemical reactions in the chamber.

Also as in the above embodiment part 42 could be made of sentered C36000 and the rest of the electrode could be made of C26000 brass. Thus, any exposed portion of part 42 should develop a insulating fluoride level. Close alternatively to this design would use the above porous sintered brass for part 42 shown in FIG. 6A with provisions for flowing the $F_2$ free gas through part 42.

Flow Shaping

Figure 12B:
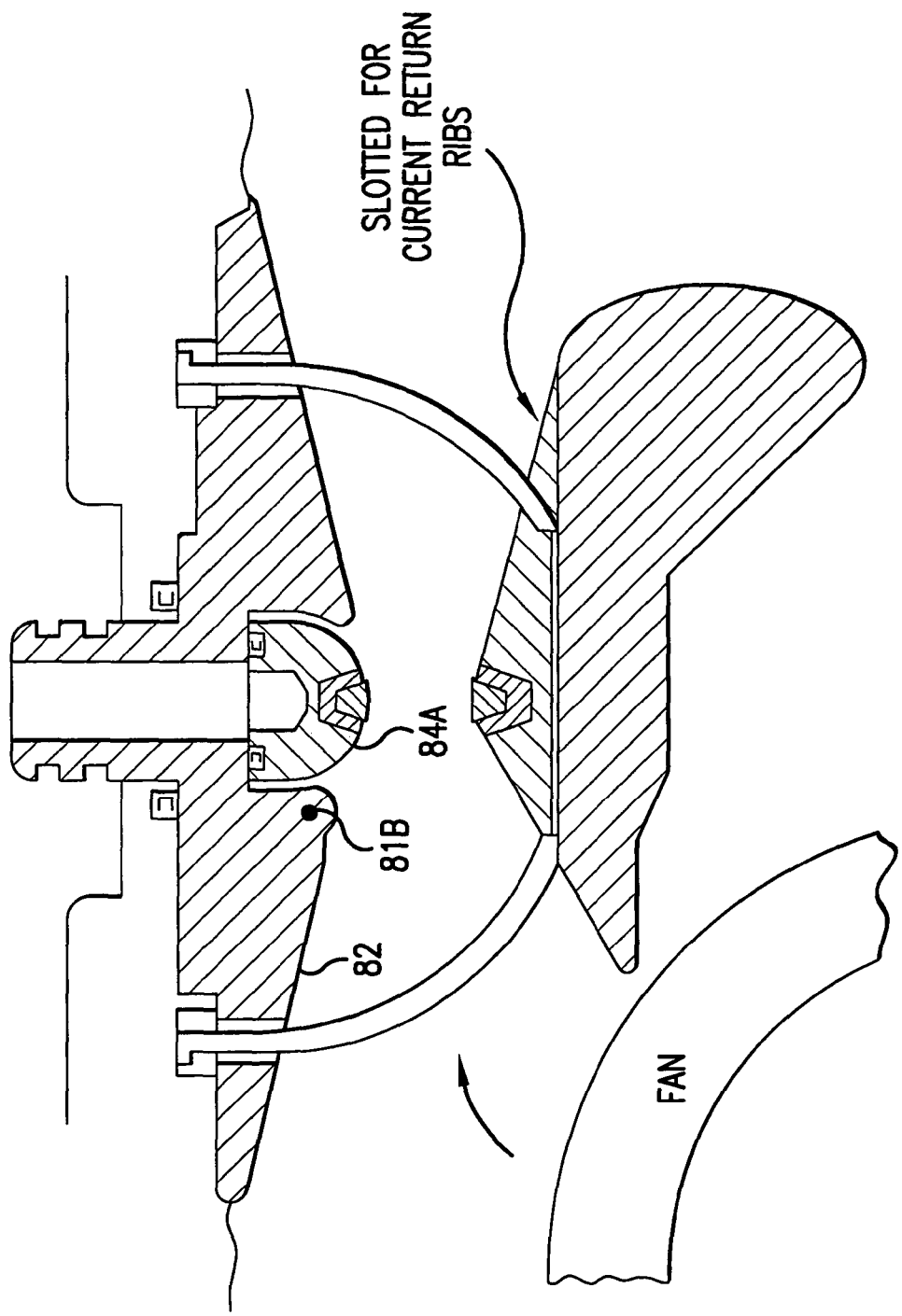

For these gas discharge lasers it is necessary to provide laser gas circulation sufficient to remove from the discharge substantially all of the debris produced during a discharge prior to the next succeeding pulse. Lasers currently in production operate at pulse rates of 4000 Hz which means that the discharge region about 4 mm wide must be cleared during the 1/4000 second (0.25 millisecond) between pulses. This requires a gas speed between the electrodes of at least 16 m/second (about 58 kilometers/hour). Future plans are for 6,000 Hz to 10,000 Hz lasers. These speeds, in the range of 100 kilometers per hour, will require a very aerodynamic designed discharge region. FIG. 12A shows a design with improved flow shaping in which the components in the discharge region are modified slightly to provide a substantial improvement in aerodynamic parameters. In this case the pre-ionizer 12A has a non-cylindrical shape and the ground rod 12A1 is positioned to encourage electron accumulation at the bottom surface. FIG. 12B shows another aerodynamic design in which the pre-ionizer is built into the main insulator for a major improvement in the aerodynamics. Ground rod 81B is inserted into main insulator 82 and runs parallel to and along the entire lengths of the electrodes. Pre-ionization is produced at the beginning of the pulse by high energy electrons tracking from the base of cathode 84A along the surface of insulator 82 and attempting to reach ground rod 81B. The tracking electron and associated plasma generate high energy ultraviolet photons and which ionize gas in the discharge region in order to encourage electric discharges early in the electric pulse cycle.

Current Return

Figure 11:
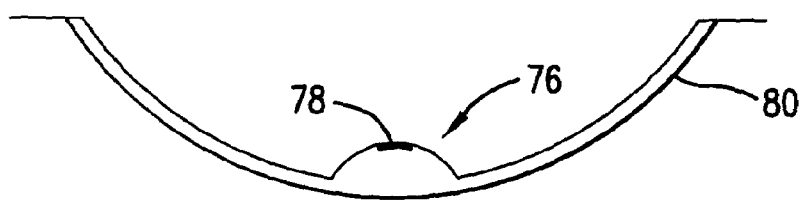
FIG. 11 shows a current return-anode unit.

In another preferred embodiment, the current return for the laser is fabricated into a shape as shown in FIG. 11. In this case, the center portion of the current return 76 has a cross section similar to the cross section of a prior art anode so as to produce a very high electric field along the center of the structure. This very high electric field is about 3.5 mm wide defining a discharge region about 3.5 mm wide and the field decreases very sharply on both sides of the discharge region. A porous insulating layer 78 is created covering the discharge region. This layer can be created using any of the techniques described above. For example, current return may be machined from C26000 brass with C36000 insert at the discharge region as shown in FIG. 6A. The preferred embodiment current return has about 40 whale-bone shaped structures 80 on both sides. The top of the current return bolts to the top of the chamber and the electrode portion may be bolted to a stiff electrode support. As with the other embodiment of this invention the current return material is chosen so that material on both sides of the 3.5 mm wide discharge surface is a material which erodes faster than the material forming the discharge surface.

Porous Coating for Cathode Discharge Surface

Until now cathode erosion in these gas discharge lasers has not been considered a problem since the anodes have eroded at about four times the rate of the cathodes. In a preferred embodiment cathode discharge surface is also covered with a porous insulating material. The reader should understand that a lead fluoride layer will not develop naturally on the cathode because the cathode repels negatively charged fluorine ions during the main portion of the discharge pulse time. However, a coated cathode could be produced in an $F_2$ environment with the cathode operating as an anode. Also, the other techniques described above for providing the porous insulating layer for the anode could be used to produce cathodes with porous insulating layers covering the discharge region. Those layers would protect the cathode from positive ion bombardment in the same manner as the described anode protective layers shield it from negative fluorine ion bombardment. As above, material on both sides of the discharge surface erodes faster than the material on the discharge surface.

While the invention has been described above with specificity in terms of preferred embodiments, the reader should understand and recognize that many changes and alterations could be made without deviating from the spirit of the invention. As indicated above the two electrode materials may be selected such that erosion rates of the first material is about ¼ to ½ that of the second electrode material but second materials with erosion rates very high (such as 10 to 20 times higher) compared to the first material could be used. This would assure that any tendency of the beam to spread would be quickly eliminated. It is important to maintain good flow conditions in the gap between the electrodes to clear the gap of discharge debris prior to the next pulse. The width of the porous insulating layer should preferably correspond to the width of the discharge surface which preferably is about equal to the desired width of the laser beam or slightly larger than the beam width. The thickness of the insulating layer should preferably be between about 20 microns and 300 microns with a most preferred range of about 50 to 150 microns. However, the thickness of some of Applicants' test anodes have ranged up to about 1 mm without causing serious problems. Two trenches could be provided along both edges of the discharge surface when the electrodes are fabricated. This avoids having the trenches develop naturally during operation of the laser due to erosion. An additional advantage of the two-material electrodes, not described above, is that it could be a cost saving idea in that it would allow a major reduction in the quantity of the first (low erosion) material. This would permit economical use of very expansive low erosion material at the discharge surface and much less costly material as the remainder of the electrode. Several good techniques are available for fixing the first material (e.g., 42 in FIG. 6) into the second material structure 40. For example, it could be shrunk fit, welded, braised or held in with small screws. Part 42 could be cut from a stack of about 35 thin (such as 0.1 mm) sheets of an insulator material such as alumina (each sheet having deposited on it a very thin layer of a conducting material such as copper). (The stacks could be heat treated to fuse the layers together prior to cutting out part 42). Part 42 would be cut so that it is about 50 cm long, about 5 mm high and about 3.5 mm wide. The part is then inserted into part 40 as shown in FIG. 6, but in this case the cross-section of part 42 is rectangular. In operation current flows through the copper layers between the sheets of alumina to the conductor material in Part 40. Electrodes utilized in some prior art situations have had rounded or other arched surfaces at discharge regions. These arched surfaces tend to become flattened due to erosion after a few million pulses. This occurs typically in Applicants' lasers during a burn-in period. Applicants have discovered that this burn-in period can be shortened if the arched surface electrode of this is flattened when the electrode is fabricated. The pre-ionizer tube shown in FIG. 12A could be provided with a flattened portion which would be matched with a correspondingly shaped holder built into the main insulator which would prevent any rotation of said pre-ionizer. This would assure in the case of the conductive coating that there always is contact between the shin and the coating. Matching flat surfaces also prevent rotational movement of the pre-ionizer which could otherwise cause wearing of the shim. Therefore, the scope of the invention should be determined by the appended claims and their legal equivalents.

We claim:

1. A process for producing an elongated electrode for use in a gas discharged laser with a lasing gas mixture comprising fluorine comprising the steps of:
   a) using an elongated electrode structure comprised of one or more electrical conducting materials and having a long dimension of at least 50 centimeters and a width of at least 3 centimeters,
   b) creating a porous insulating layer on a portion of the elongated electrode, the portion defining a discharge region having a width of at least 3 millimeters the porous insulating layer having sufficient porosity to pass sufficient electrons to provide an effective discharge between the electrode and a second electrode and the porous insulating layer inhibiting chemical reaction between the electrode and fluorine.

2. A process as in claim 1 wherein the one or more electrically conducting materials comprise a lead rich brass having a lead content of greater than 1 percent, and the step of creating the porous electrical insulating layer comprises operating the electrode in a fluorine containing laser gas to permit a porous insulating layer to build up on the lead rich brass.

3. A process as in claim 1 wherein the step of creating the porous insulating layer comprises spreading insulating particles on the discharge region of the elongated electrode structure.

4. A process as in claim 1 wherein said step of creating the porous insulating layer comprises the steps of:
   a) mixing insulating particles in a molten metal to produce a discharge section of the elongated electrode the section comprising a filler metal and the insulating particles,
   b) operating the elongated electrode in a fluorine containing laser gas environment to permit a portion of the filler metal to sputter away leaving a porous insulating layer covering the discharge region.

5. A process as in claim 1 wherein the step of creation of porous insulating layer includes the substeps of:
   a. creating a plurality of nucleation sites on the discharge region;
   b. operating the electrode in a laser containing fluorine gas so as to permit the porous insulating layer to grow on the discharge region.

* * * * *